US009231006B2

(12) United States Patent
Kawahito et al.

(10) Patent No.: US 9,231,006 B2
(45) Date of Patent: Jan. 5, 2016

(54) SEMICONDUCTOR ELEMENT AND SOLID-STATE IMAGING DEVICE

(75) Inventors: Shoji Kawahito, Hamamatsu (JP); Tomonari Sawada, Toyota (JP)

(73) Assignee: National University Corporation Shizuoka University, Shizuoka-shi (JP)

(*) Notice: Subject to any disclaimer, the term of this patent is extended or adjusted under 35 U.S.C. 154(b) by 945 days.

(21) Appl. No.: 13/500,331

(22) PCT Filed: Oct. 5, 2010

(86) PCT No.: PCT/JP2010/067452
§ 371 (c)(1),
(2), (4) Date: Apr. 5, 2012

(87) PCT Pub. No.: WO2011/043339
PCT Pub. Date: Apr. 14, 2011

(65) Prior Publication Data
US 2012/0193743 A1    Aug. 2, 2012

(30) Foreign Application Priority Data
Oct. 5, 2009    (JP) .................... 2009-231587

(51) Int. Cl.
*H01L 27/148*    (2006.01)
*H01L 31/102*    (2006.01)
(Continued)

(52) U.S. Cl.
CPC ......... *H01L 27/14609* (2013.01); *G01S 7/4816* (2013.01); *G01S 7/4863* (2013.01);
(Continued)

(58) Field of Classification Search
CPC .................. H01L 27/14609; H01L 27/14603; H01L 27/14612; H01L 27/14656; H01L 27/14654; H01L 27/14614; H01L 27/14616; H01L 27/14643; G01S 7/4816; G01S 7/4863; G01S 7/4861; G01S 7/486; H04N 5/357; H04N 5/37452; H04N 5/3745; H04N 5/378
See application file for complete search history.

(56) References Cited

U.S. PATENT DOCUMENTS 4,847,668 A * 7/1989 Sugawa et al. ............... 257/462
5,856,667 A    1/1999 Spirig et al.
(Continued)

FOREIGN PATENT DOCUMENTS

EP    2 487 714 A1    8/2012
JP    10 508736    8/1998
(Continued)

OTHER PUBLICATIONS

International Search Report Issued Nov. 9, 2010 in PCT/JP10/67452 Filed Oct. 5, 2010.
(Continued)

*Primary Examiner* — John Lee
(74) *Attorney, Agent, or Firm* — Oblon, McClelland, Maier & Neustadt, L.L.P.

(57) ABSTRACT

A solid-state imaging device includes a semiconductor region of p-type; a buried region of n-type, configured to serve as a photodiode together with the semiconductor region; a extraction region of n-type, configured to extract charges generated by the photodiode from the buried region, having higher impurity concentration than the buried region; a read-out region of n-type, configured to accumulate charges, which are transferred from the buried region having higher impurity concentration than the buried region; and a potential gradient changing mechanism, configured to control a potential of the channel, and to change a potential gradient of a potential profile from the buried region to the read-out region and a potential gradient of a potential profile from the buried region to the extraction region, so as to control the transferring/extraction of charges.

18 Claims, 8 Drawing Sheets

(51) Int. Cl.
*H01L 27/146* (2006.01)
*G01S 7/481* (2006.01)
*G01S 7/486* (2006.01)
*H04N 5/359* (2011.01)
*H04N 5/3745* (2011.01)
*H04N 5/378* (2011.01)

(52) U.S. Cl.
CPC .... *H01L27/14603* (2013.01); *H01L 27/14607* (2013.01); *H01L 27/14612* (2013.01); *H01L 27/14656* (2013.01); *H04N 5/359* (2013.01); *H04N 5/378* (2013.01); *H04N 5/37452* (2013.01)

(56) References Cited

U.S. PATENT DOCUMENTS

| | | | | |
|---|---|---|---|---|
| 5,986,297 | A * | 11/1999 | Guidash et al. | 257/223 |
| 6,051,447 | A * | 4/2000 | Lee et al. | 438/48 |
| 7,061,033 | B2 * | 6/2006 | Takamura | 257/292 |
| 7,361,877 | B2 | 4/2008 | McGrath et al. | |
| 7,910,964 | B2 * | 3/2011 | Kawahito et al. | 257/292 |
| 8,247,848 | B2 * | 8/2012 | Kawahito | 257/222 |
| 8,289,427 | B2 * | 10/2012 | Kawahito | 348/302 |
| 8,338,248 | B2 * | 12/2012 | Kawahito | 438/233 |
| 8,558,293 | B2 * | 10/2013 | Kawahito et al. | 257/292 |
| 8,587,709 | B2 * | 11/2013 | Kawahito et al. | 348/302 |
| 8,907,388 | B2 * | 12/2014 | Kawahito | 257/292 |
| 2001/0040210 | A1 | 11/2001 | Nagata | |
| 2002/0017661 | A1 * | 2/2002 | Shinohara | 257/238 |
| 2002/0100915 | A1 * | 8/2002 | Hynecek | 257/158 |
| 2003/0098454 | A1 * | 5/2003 | Maeda et al. | 257/22 |
| 2003/0148574 | A1 * | 8/2003 | Thomas et al. | 438/201 |
| 2004/0201047 | A1 * | 10/2004 | Takamura | 257/292 |
| 2004/0217351 | A1 * | 11/2004 | Takamura | 257/59 |
| 2004/0245433 | A1 * | 12/2004 | Koyama | 250/208.1 |
| 2005/0139943 | A1 * | 6/2005 | Kanbe | 257/431 |
| 2005/0168604 | A1 * | 8/2005 | Mishina et al. | 348/294 |
| 2005/0189546 | A1 * | 9/2005 | Yasukawa et al. | 257/79 |
| 2005/0194653 | A1 * | 9/2005 | Hynecek et al. | 257/443 |
| 2005/0280046 | A1 * | 12/2005 | Shin | 257/226 |
| 2006/0181626 | A1 * | 8/2006 | Lee | 348/308 |
| 2006/0255369 | A1 * | 11/2006 | Kim et al. | 257/219 |
| 2008/0142856 | A1 * | 6/2008 | Sato et al. | 257/292 |
| 2008/0277700 | A1 * | 11/2008 | Kawahito | 257/292 |
| 2009/0050998 | A1 * | 2/2009 | Miura | 257/461 |
| 2009/0114919 | A1 * | 5/2009 | Kawahito et al. | 257/59 |
| 2009/0134396 | A1 * | 5/2009 | Kawahito et al. | 257/72 |
| 2009/0230437 | A1 * | 9/2009 | Kawahito et al. | 257/226 |
| 2009/0243025 | A1 * | 10/2009 | Stevens et al. | 257/461 |
| 2009/0256176 | A1 * | 10/2009 | Kobayashi et al. | 257/225 |
| 2010/0073541 | A1 * | 3/2010 | Kawahito | 348/311 |
| 2011/0031543 | A1 * | 2/2011 | Kawahito | 257/292 |
| 2011/0187908 | A1 * | 8/2011 | Kawahito et al. | 348/306 |
| 2011/0298079 | A1 * | 12/2011 | Kawahito | 257/443 |
| 2012/0193692 | A1 * | 8/2012 | Kawahito et al. | 257/292 |
| 2012/0193743 | A1 * | 8/2012 | Kawahito et al. | 257/435 |

FOREIGN PATENT DOCUMENTS

| | | |
|---|---|---|
| JP | 2001 326341 | 11/2001 |
| JP | 2003 510561 | 3/2003 |
| JP | 2008-4692 A | 1/2008 |
| JP | 2008 103647 | 5/2008 |
| JP | 2008 252814 | 10/2008 |
| WO | 2010 074252 | 7/2010 |

OTHER PUBLICATIONS

English Translation of International Preliminary Report on Patentability issued May 18, 2012 in PCT/JP2010/067452.
U.S. Appl. No. 13/501,017, filed Apr. 9, 2012, Kawahito, et al.
Extended European Search Report issued on Jan. 30, 2014 in the corresponding European Application No. 10822009.6.

* cited by examiner (a)

(b)

(c)

(a)

(b)

(c)

SEMICONDUCTOR ELEMENT AND SOLID-STATE IMAGING DEVICE

TECHNICAL FIELD

The present invention relates to a semiconductor element that has a function for modulating detected electrons, which are generated by light, in a time domain, and a solid-state imaging device in which these semiconductor elements are arrayed one-dimensionally or two-dimensionally.

BACKGROUND ART

A sensor element disclosed in "DEVICE AND METHOD FOR THE DETECTION AND DEMODULATION OF AN INTENSITY-MODULATED RADIATION FIELD (see patent literature (PTL) 1)" published in 1994, or in other documents, which has a function for modulating, in a time domain, the detection of electrons generated by light in a pixel, is referred to as a "lock-in pixel". By applying the sensor element encompassing the lock-in pixels to a buried photodiode structure used in recent CMOS image sensors, if a lock-in image sensor can be established, because the sensor element is superior in mass productivity, a realization of a high performance image sensor being manufactured at low price is expected.

For example, a three-dimensional imaging system including a two-dimensional array implemented by pixel-photo detectors, dedicated electronic circuits and corresponding processors, which are merged in a common IC, by using a CMOS manufacturing technique, is proposed (see PTL 2). In one embodiment of PTL 1, each detector has a corresponding high-speed counter for accumulating the number of clock pulses that is proportional to a time of flight (TOF) about pulses, which are radiated by the system, reflected from a point of a physical body, and focused, and then detected by the pixel-photo detector. A TOF data gives a direct digital scale with regard to a distance between the particular pixel and the point on the physical body for reflecting the radiated optical pulse. In a second embodiment of PTL 2, the counter and a high-speed clock circuit are not provided. Instead of them, a charge accumulator and an electronic shutter (S1) are provided in each pixel detector. Each pixel detector accumulates charges, and its total amount gives the direct scale of the round-trip TOF.

However, in the conventional image sensors that use the lock-in pixels, each of the lock-in pixels detects transferring-operations of charges to one or more accumulation regions, through a gate structure of a MOS transistor, in synchronization with the modulated light. Consequently, the conventional image sensor that uses the lock-in pixels is intricate in structure. Also, in the case of the transfer through the gate structure of the MOS transistor, electrons are captured in traps at a boundary between silicon (Si) and silicon oxide film ($SiO_2$), and a problem of transfer delay is also generated.

Consequently, one of the inventors proposed a structure in which a semiconductor element serving as each of the pixels in a solid-state imaging device encompassing a light-receiving surface-buried region of n-type to which light is entered; a charge accumulation region of n-type, being buried at a position partially overlapping with the light-receiving surface-buried region, in a planar pattern, and is deeper in potential well (electron well) than the light-receiving surface-buried region, configured to accumulate charges generated by the light-receiving surface-buried region; a charge-read-out region of n-type, configured to receive charges accumulated in the charge accumulation region; and first and second extracting-drain regions of n-type, which are arranged on both sides of the light-receiving surface-buried region, respectively, on the planar pattern, so as to extract electrons generated by the light-receiving surface-buried region (see PTL 3). Here, the light-receiving surface-buried region and the first and second extracting-drain regions are buried in a part of a surface of a semiconductor region of p-type. On the light-receiving surface-buried region, a $p^+$-type pining layer is arranged. On the $p^+$-type pining layer, on the semiconductor region between the $p^+$-type pining layer and the first extracting-drain region, and on the semiconductor region between the $p^+$-type pining layer and the second extracting-drain region, gate insulation films are formed. Then, on the gate insulation films, in order to extract electrons generated by the light-receiving surface-buried region to the first and second extracting-drain regions, respectively, first and second extraction-gate electrodes are arranged, on both sides of the light-receiving surface-buried region, so as to sandwich the light-receiving surface-buried region, on the planar pattern.

In the structure disclosed in PTL 3, between the charge accumulation region and the charge-read-out region, a read-out gate electrode for transferring charges to the charge-read-out region from the charge accumulation region is arranged, and the read-out gate electrode controls a potential of a transfer channel formed between the charge accumulation region and the charge-read-out region through a gate insulation film so as to transfer charges from the charge accumulation region to the charge-read-out regions. The combination of the gate insulation film and the first and second extraction-gate electrodes on the gate insulation film controls the potential of a channel formed in the upper portion of the semiconductor region between the light-receiving surface-buried region and the first extracting-drain region, and the potential of a channel formed in the upper portion of the semiconductor region between the light-receiving surface-buried region and the second extracting-drain region, respectively, so as to extract charges from the light-receiving surface-buried region to the first and second extracting-drain regions, respectively.

According to the structure disclosed in PTL 3, even if a gate structure is not provided between the light-receiving surface-buried region and the charge accumulation region, it is possible to control the transferring of charges from the light-receiving surface-buried region to the charge accumulation region, by changing potential profiles on the basis of voltages applied to the first and second extraction-gate electrodes.

CITATION LIST

Patent Literature

PTL 1: JP 1998(H10)-508736A
PTL 2: JP 2003-510561A
PTL 3: WO 2010/074252A

SUMMARY OF INVENTION

Technical Problem

In the semiconductor element proposed in PTL 3, the modulation of the transferring direction of electrons, which is carried out by the first and second extraction-gate electrodes, is achieved by controlling a potential distribution (potential profile) on a charge-transferring route through electrostatic induction action. However, when the extraction-gate electrodes exist on both of the sides of the light-receiving surface-buried region, not only the structure becomes complicate, but also a potential gradient becomes zero at the vicinity of the center of the charge-transferring route. Consequently, there is a possibility that a part of charges are left, which results in a trouble that charges cannot be efficiently transferred.

The present invention is considered in view of the above problems. Then, an object of the present invention is to provide a solid-state imaging device, in which the trouble that the potential gradient becomes zero at the vicinity of the center on the transferring-path of charges is removed, and the potential gradient is generated in the overall width of the charge-transferring route, and consequently thereto, the transfer efficiency of charges is good, and the structure of the pixel is simple, and a high resolution and a high-speed operation are possible, and a semiconductor element which can be used as a sensor element (pixel) in the solid-state imaging device.

Solution to Problem

In order to achieve the above objects, a first aspect of the present invention inheres in a semiconductor element encompassing (a) a semiconductor region of a first conductivity type, (b) a buried region of a second conductivity type, being buried in a part of an upper portion of the semiconductor region, configured to serve as a photodiode together with the semiconductor region, (c) a extraction region of the second conductivity type, being separated from the buried region and allocated in a part of the semiconductor region, configured to extract charges generated by the photodiode from the buried region at a particular timing, having higher impurity concentration than the buried region, (d) a read-out region of the second conductivity type, being provided in a part of the semiconductor region, configured to accumulate charges transferred from the buried region when charges are not extracted, until charges are read out, having higher impurity concentration than the buried region, and (e) a potential gradient changing means, being provided in an upper portion of a channel provided in the semiconductor region between the buried region and the extraction region, configured to control a potential of the channel, and to change at least a part of a potential gradient of a potential profile from the buried region to the read-out region and a potential gradient of a potential profile from the buried region to the extraction region, so as to control at least a part of the transferring of charges and the extraction of charges.

A second aspect of the present invention inheres in a solid-state imaging device, in which a plurality of semiconductor elements prescribed by the first aspect are arrayed as pixels.

Advantageous Effects of Invention

According to the present invention, it is possible to provide a solid-state imaging device in which the trouble that the potential gradient becomes zero at the vicinity of the center on the transferring-path of charges is removed, and the potential gradient is generated in the overall width of the charge-transferring route, and consequently thereto, the transfer efficiency of charges is good, and the structure of the pixel is simple, and the high resolution and the high-speed operation are possible, and a semiconductor element which can be used as the sensor element (pixel) in the solid-state imaging device

BRIEF DESCRIPTION OF DRAWINGS

FIG. 3 (b) is a potential diagram describing a manner in which charges are transferred to an accumulation region.

FIG. 3 (c) is a potential diagram describing a manner in which charges are extracted to a extraction region.

FIG. 9 (b) is a potential diagram describing a manner at timing when charges are scheduled to be transferred to a read-out region.

FIG. 9 (c) is a potential diagram describing a manner when charges are extracted to a extraction region.

DESCRIPTION OF EMBODIMENTS

Figure 1:
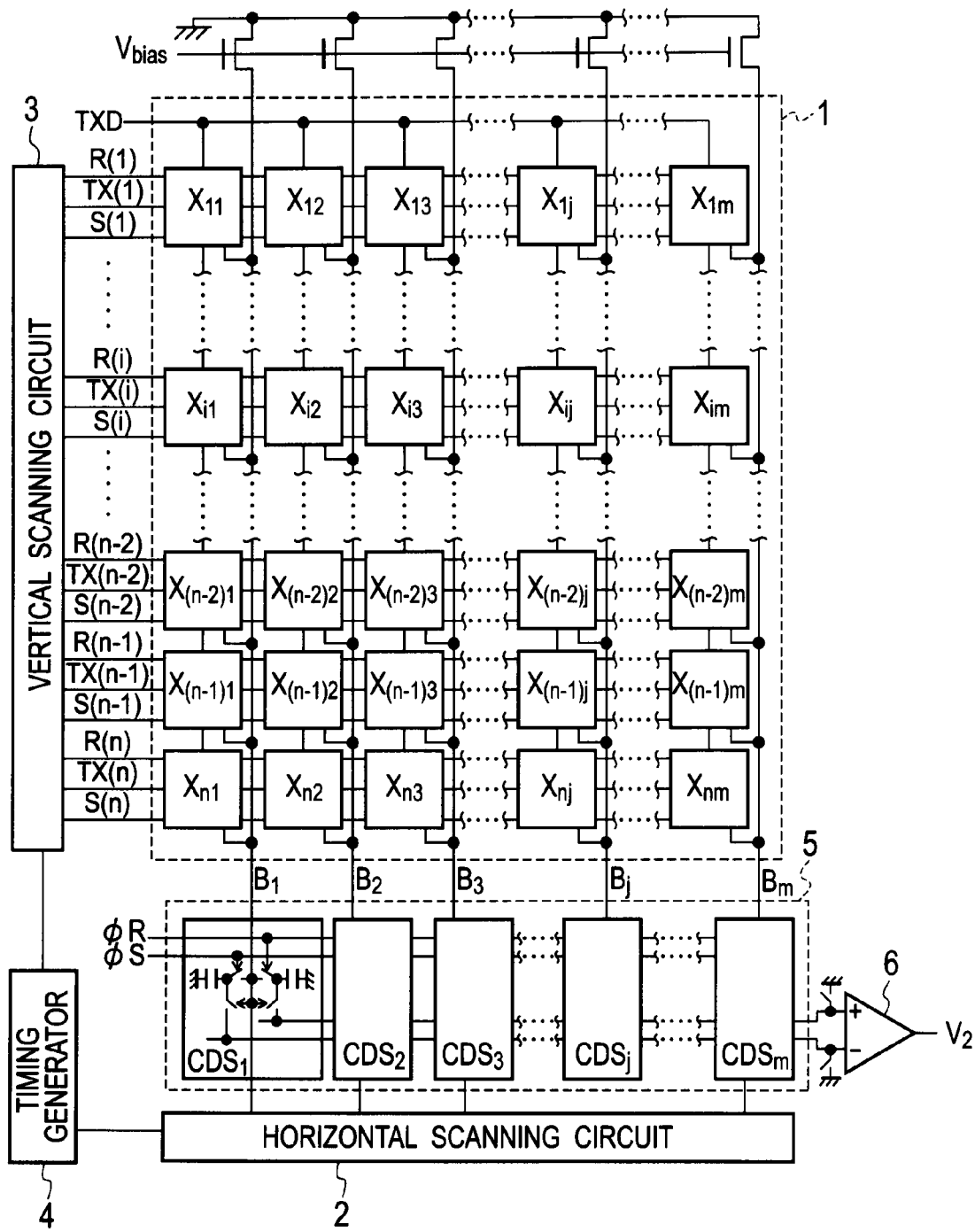
FIG. 1 is a schematic plan view describing a layout on a semiconductor chip of a solid-state imaging device (two-dimensional image sensor) pertaining to a first embodiment of the present invention.

The first to third embodiments of the present invention will be described below with reference to the drawings. In the descriptions of the following drawings, the same or similar reference numerals are given to the same or similar portions. However, attention should be paid to a fact that, since the drawings are only schematic, a relation between a thickness and a planar dimension, and a ratio between the thicknesses of respective layers, and the like differ from the actual values. Thus, the specific thicknesses and dimensions should be judged by referring to the following explanations. Also, naturally, the portion in which the relation and ratio between the mutual dimensions are different is included even between the mutual drawings.

Also, because the following first to third embodiments are mere examples of the devices and methods to embody the technical idea of the present invention, the first to third embodiments can be applied to the solid-state imaging device for bioimaging that measures the fluorescence from a dyed biological cell or the life of fluorescence, or various solid-state imaging devices, such as a temporal correlation image sensor and the like, for carrying out various measurements. Also, in the technical idea of the present invention, the material quality, shape, structure, arrangement and the like of a configuration part are not limited to the followings, and various changes can be added to the technical idea of the present invention, within the technical scopes prescribed by claims.

First Embodiment

In a solid-state imaging device (two-dimensional image sensor) pertaining to a first embodiment of the present invention, as illustrated in FIG. 1, a pixel array 1 and peripheral circuits (2, 3, 4, 5 and 6) are integrated on a same semiconductor chip. In the pixel array 1, a large number of pixels $X_{ij}$ (i=1 to m; j=1 to n: where m, n are integers, respectively) are arrayed in a shape of a two-dimensional matrix, and for example, a rectangular imaging region is established. On the lower side of the pixel array 1, a horizontal scanning circuit 2 is provided along pixel rows $X_{11}$ to $X_{1m}$; - - - ; $X_{i1}$ to $X_{im}$; - - - ; $X_{(n-2)1}$ to $X_{(n-2)m}$; $X_{(n-1)1}$ to $X_{(n-1)m}$; and $X_{n1}$ to $X_{nm}$ directions. On the left side of the pixel array, a vertical scanning circuit 3 is provided along pixel columns $X_{11}$, - - - , $X_{i1}$, - - - , $X_{(n-2)1}$, $X_{(n-1)1}$, $X_{n1}$; $X_{12}$, - - - , $X_{i2}$, - - - ; $X_{(n-2)2}$, $X_{(n-1)2}$, $X_{n2}$; $X_{13}$, - - - , $X_{i3}$, - - - ; $X_{(n-2)3}$, $X_{(n-1)3}$, $X_{n3}$; - - - ; $X_{1j}$, - - - , $X_{ij}$, - - - , $X_{(n-2)j}$, $X_{(n-1)j}$, $X_{nj}$; - - - ; $X_{1m}$, - - - , $X_{im}$, - - - , $X_{(n-2)m}$, $X_{(n-1)m}$, and $X_{nm}$ directions. A timing generator 4 is connected to the vertical scanning circuit 3 and the horizontal scanning circuit 2.

The timing generator, the horizontal scanning circuit 2 and the vertical scanning circuit 3 sequentially scan the unit pixel $X_{ij}$ in the pixel array, and a reading-out operation of pixel signals and an electronic shuttering operation are executed. That is, the solid-state imaging device pertaining to the first embodiment is organized such that, since the pixel array is vertically scanned at the respective pixel rows $X_{11}$ to $X_{1m}$; - - -; $X_{i1}$ to $X_{im}$; - - -; $X_{(n-2)1}$ to $X_{(n-2)m}$; $X_{(n-1)1}$ to $X_{(n-1)m}$; and $X_{n1}$ to $X_{nm}$ units, the pixel signal of each of the pixel rows $X_{11}$ to $X_{1m}$; - - -; $X_{i1}$ to $X_{im}$; - - -; $X_{(n-2)1}$ to $X_{(n-2)m}$; $X_{(n-1)1}$ to $X_{(n-1)m}$; and $X_{n1}$ to $X_{nm}$ is read out through a vertical signal line laid for each of the pixel columns $X_{11}$, - - - , $X_{i1}$, - - - , $X_{(n-2)1}$, $X_{(n-1)1}$, $X_{n1}$; $X_{12}$, - - - , $X_{i2}$, - - - ; $X_{(n-2)2}$, $X_{(n-1)2}$, $X_{n2}$; $X_{13}$, - - - , $X_{i3}$, - - - ; $X_{(n-2)3}$, $X_{(n-1)3}$, $X_{n3}$; - - - ; $X_{1j}$, - - - , $X_{ij}$, - - - , $X_{(n-2)j}$, $X_{(n-1)j}$, $X_{nj}$; - - - ; $X_{1m}$, - - - , $X_{im}$, - - - , $X_{(n-2)m}$, $X_{(n-1)m}$ and $X_{nm}$.

Figure 2:
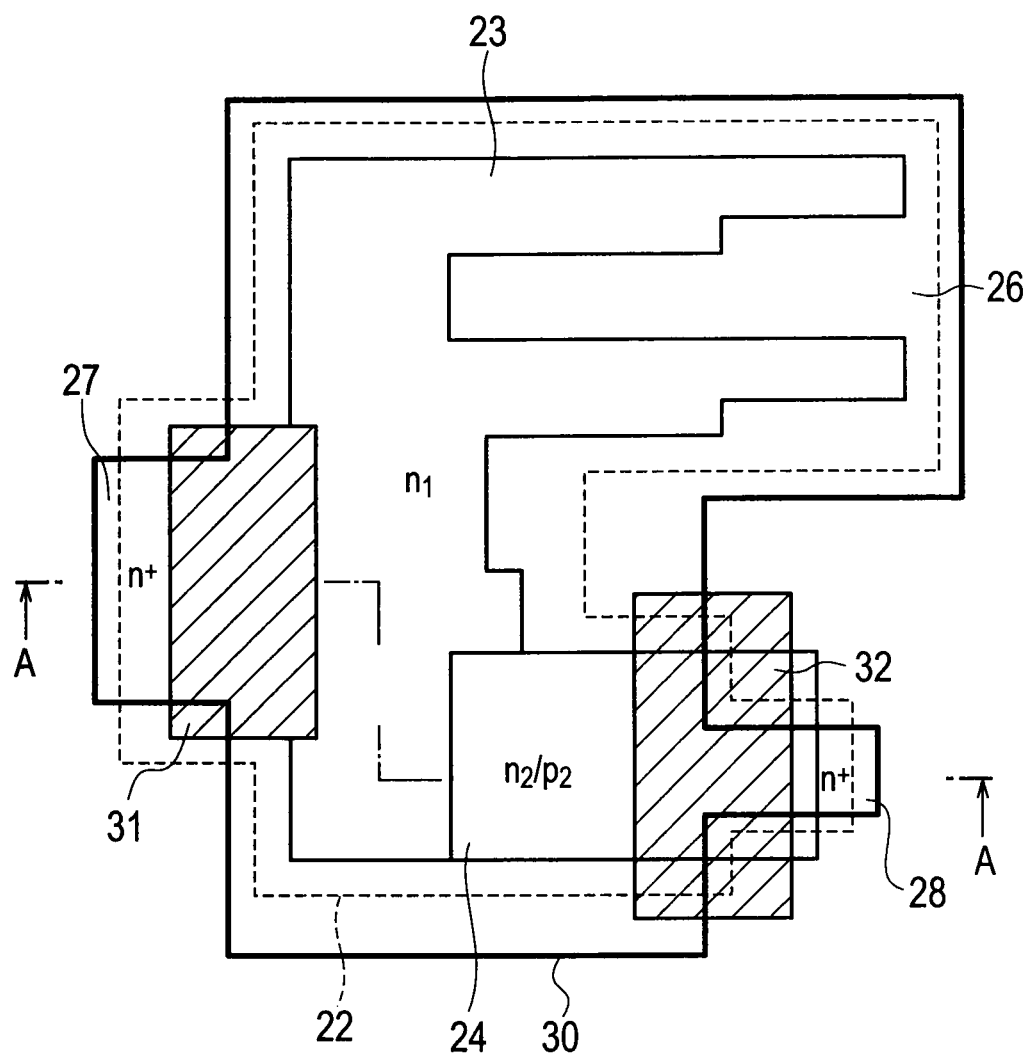
FIG. 2 is a schematic plan view describing a configuration of a semiconductor element that serves as a part of pixels in the solid-state imaging device pertaining to the first embodiment.
Figure 3:
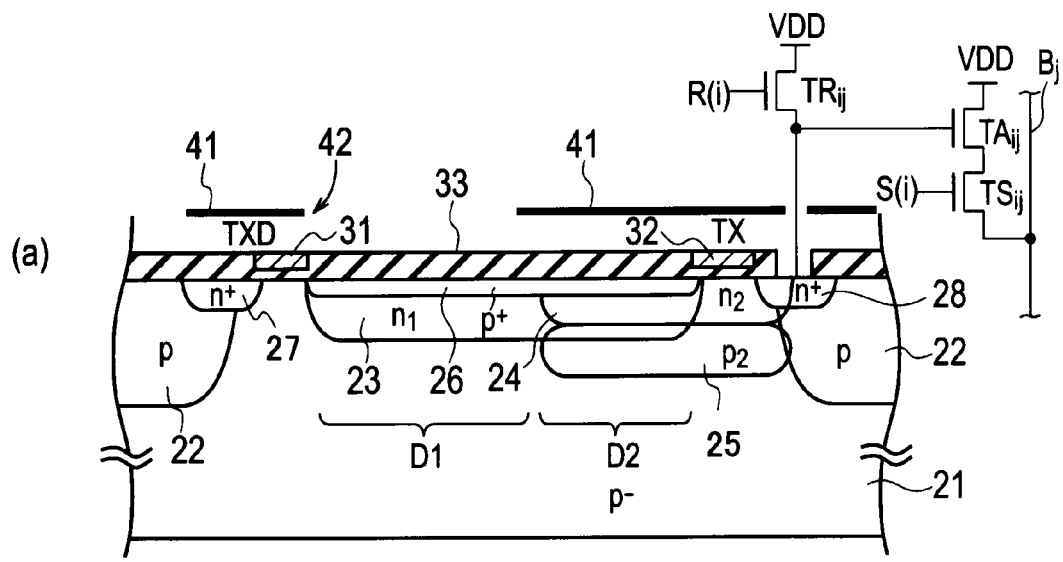
FIG. 3 (a) is a schematic cross-sectional view when viewed from an A-A direction in FIG. 2.
Figure 3:
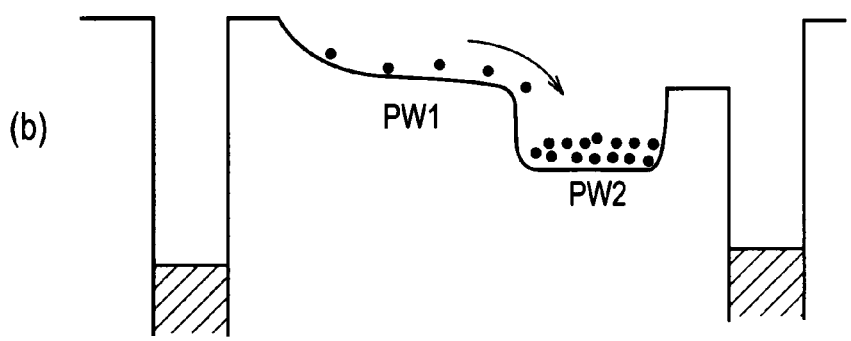
Figure 3:
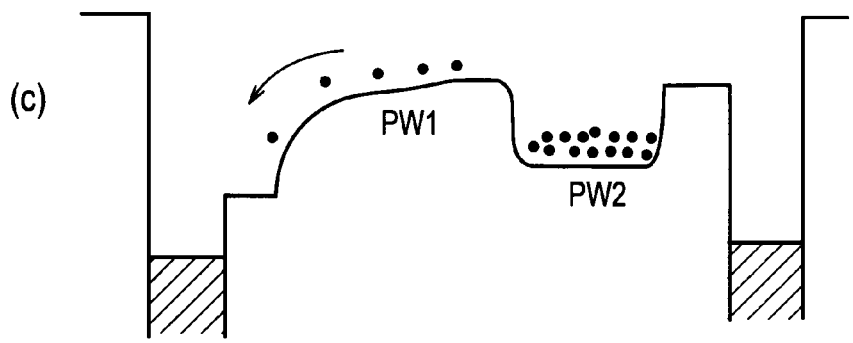

FIG. 2 illustrates one example of the planar structure of the semiconductor element that serves as each of the pixels $X_{11}$ to $X_{1m}$; - - -; $X_{i1}$ to $X_{im}$; - - -; $X_{(n-2)1}$ to $X_{(n-2)m}$; $X_{(n-1)1}$ to $X_{(n-1)m}$; and $X_{n1}$ to $X_{nm}$ in the solid-state imaging device pertaining to the first embodiment, and FIG. 3 (a) illustrates the corresponding cross-sectional view taken from A-A direction of the semiconductor element in the plan view of FIG. 2. As illustrated in FIG. 3 (a), the semiconductor element serving as a part of the pixel $X_{ij}$ includes: a semiconductor region 21 of a first conductivity type (p-type); a buried region (light receiving cathode region) 23 of a second conductivity type (n-type) that is buried in the upper portion of the semiconductor region 21 and being irradiated with light; an accumulation region 24 of a second conductivity type ($n^+$-type), which partially overlaps with the buried region (light receiving cathode region) 23 in a part of the upper portion of the semiconductor region 21 and is buried adjacently (continuously) to the buried region 23 and is deep in the depth of a potential valley (electronic well) as compared with the buried region 23 (see FIGS. 3 (b) and 3 (c)) and accumulates charges generated by the buried region 23; a block layer 25 of the first conductivity type ($p^+$-type) which is located below the accumulation region 24 and high in impurity concentration as compared with the semiconductor region 21; a read-out region 28 of the second conductivity type ($n^+$-type) which is buried in a part of the upper portion of the semiconductor region 21 while separated on the right side from the accumulation region 24 and receives charges accumulated in the accumulation region 24; and a extraction region 27 of the second conductivity type ($n^+$-type) which is buried in a part of the upper portion of the semiconductor region 21 while separated on the left side from the buried region 23 and extracts electrons generated by the buried region 23. A pining layer 26 of the first conductivity type ($p^+$-type) is arranged from a site on the buried region 23 to a site on the accumulation region 24. The pining layer 26 is the layer for suppressing carriers from being generated on the surface at a dark time and also suppressing signal carriers from being captured, and the pining layer 26 is used as the layer preferable for reducing the dark current and the capture of the signal carriers.

As illustrated by a dashed line in FIG. 2, a well region (p-well) 22 of the first conductivity type that is higher in impurity concentration than the semiconductor region 21 is delineated so as to surround the pining layer 26, the buried region 23 below the pining layer 26, the read-out region 28 and the extraction region 27. FIG. 3 (a) exemplifies a case in which the semiconductor region 21 of the first conductivity type is used as "the semiconductor region of the first conductivity type". However, instead of the semiconductor region 21, a silicon epitaxial growth layer of the first conductivity type (p-type) whose impurity concentration is low as compared with a semiconductor substrate may be grown on the semiconductor substrate of the first conductivity type (p-type), and the epitaxial growth layer may be employed as the semiconductor region of the first conductivity type. Alternatively, an epitaxial growth layer of the first conductivity type (p-type) may be grown on the semiconductor substrate of the second conductivity type (n-type), and the epitaxial growth layer may be employed as the semiconductor region of the first conductivity type. When the epitaxial growth layer of the first conductivity type (p-type) is grown so as to form a p-n junction on the semiconductor substrate of the second conductivity type (n-type), in a case of a long wavelength, the light is penetrated into the deep portion of the semiconductor substrate of the second conductivity type. However, the potential barrier caused by the built-in potential of the p-n junction disables the carriers generated by the light, the carriers are generated in the semiconductor substrate of the second conductivity type, to be penetrated into the epitaxial growth layer of the first conductivity type. Thus, it is possible to positively remove the carriers generated in the deep portion of the semiconductor substrate of the second conductivity type. Consequently, it is possible to protect the carriers, which are generated in the deep positions, from being spread, returned and leaked into the adjacent pixel. In particular, the p-n junction provides an effectiveness that colors are not mixed in a case of a color image sensor of a single-chip on which color filters of RGB are stacked.

The buried region 23 and the semiconductor region (anode region) 21 just under the buried region 23 implement a first buried photodiode (hereafter, merely referred to as "a photodiode") D1. The accumulation region (cathode region) 24 and the semiconductor region 21 just under the accumulation region 24 implement a second buried photodiode (hereafter, referred to as "a charge-accumulation diode") D2.

A gate insulation film 33 is formed on the semiconductor region 21 on the pining layer 26 and on the semiconductor region 21 between the buried region 23 and the read-out region 28. As the gate insulation film 33, a silicon oxide film ($SiO_2$) is preferable. However, an insulated-gate structure of an insulated-gate transistor (MIS transistor), in which various insulation films other than the silicon oxide film are used, may be available. For example, an ONO film implemented by a triple-level lamination film made of silicon oxide film/silicon nitride film (Si$_3$N$_4$ film)/silicon oxide film may be available. Moreover, the oxide that includes at least one element of strontium (Sr), aluminum (Al), magnesium (Mg), yttrium (Y), hafnium (Hf), zirconium (Zr), tantalum (Ta) and bismuth (Bi), or the silicon nitride that includes those elements, or the like can be used as the gate insulation film 33.

On the upper portion of the gate insulation film 33, a read-out gate electrode 32 for controlling a potential of a transfer channel formed between the accumulation region 24 and the read-out region 28 and transferring charges from the accumulation region 24 to the read-out region 28, and an extraction-gate electrode 31 for controlling a potential of a extraction channel formed between the buried region 23 and the extraction region 27 and transferring electrons (charges) generated by the buried region 23 from the buried region 23 to the extraction region 27 are arranged on only one side of the buried region 23. The gate insulation film 33 and the extraction-gate electrode 31 on the gate insulation film 33 implement potential gradient changing means (31, 33) configured to control the potential of the channel formed in the upper portion of the semiconductor region 21 between the buried region 23 and the extraction region 27, and changing a potential profile (potential gradient), and then controlling the extraction/non-extraction of charges from the buried region 23 to the extraction region 27 and the transferring/non-transferring of the signal charges to the accumulation region 24. Also, the gate insulation film 33 and the read-out gate electrode 32 on the gate insulation film 33 implement charge transfer control means (32, 33) configured to control the potential of the channel generated in the upper portion of the semiconductor region 21 between the accumulation region 24 and the read-out region 28, and transferring charges from the accumulation region 24 to the read-out region 28.

FIGS. 3 (b) and 3 (c) are the potential diagrams taken at a horizontal cross-sectional plane, regarding the cross-sectional view of FIG. 3 (a), along which the buried region 23, the accumulation region 24 and the read-out region 28 are cut, and charges (electrons) are illustrated by closed circles. As illustrated in FIG. 3 (a), a potential valley (first potential valley) PW1 that indicates the position of the conduction band edge of the buried region 23 is represented on the left side of the center in each of FIGS. 3 (b) and 3 (c). Moreover, a potential valley (second potential valley) PW2 that indicates the position of the conduction band edge of the accumulation region 24 is represented on the right side of the first potential valley PW1. Moreover, on the right side of the second potential valley PW2, a situation in which electrons at Fermi energy level or less in the potential well of the read-out region 28 is filled is indicated by diagonal hatch with upward oblique lines to the right. Because the depth of the potential well of the read-out region 28 represents Fermi energy level, in FIGS. 3 (b) and 3 (c), the level of the top end of the region indicated by the diagonal hatch with the upward oblique lines to the right defines the depth of the potential well. The potential barrier between the second potential valley PW2 and the potential well of the read-out region 28 corresponds to the potential distribution of the conduction band edge of the semiconductor region 21 just under the read-out gate electrode 32. On the other hand, on the left side of the first potential valley PW1, a situation in which electrons at Fermi energy level or less in the potential well in the extraction region 27 are filled is indicated by the diagonal hatch with the upward oblique lines to the right. The potential barrier between the first potential valley PW1 and the potential well of the extraction region 27 corresponds to the potential distribution of the conduction band edge of the semiconductor region 21 just under the extraction-gate electrode 31 that is formed on only one side of the buried region 23.

As illustrated in FIGS. 3 (b) and 3 (c), keeping a condition such that a potential barrier is not generated between the buried region 23 and the accumulation region 24, in order to make a depth of the first potential valley PW1 when the buried region 23 is perfectly depleted shallower than a depth of the second potential valley PW2 in a staircase pattern (step pattern) when the accumulation region 24 is perfectly depleted, the respective impurity concentrations may be selected, for example, such that the impurity concentration of the accumulation region 24 is higher than the impurity concentration of the buried region 23 in the staircase pattern. As a method of setting the impurity concentration of the accumulation region 24 to be higher than the impurity concentration of the buried region 23 in the staircase pattern, it is possible to employ the known various schemes. However, in order to avoid the generation of the potential barrier caused by the displacement of photo-mask alignment in a planar pattern illustrated in FIG. 2, as illustrated in FIGS. 2 and 3 (a), n-type impurity ions are implanted into the accumulation region 24 two times (an impurity concentration $n_1$ and an impurity concentration $n_2$) so that the deep second potential valley PW2 can be formed, and n-type impurity ions are implanted into the buried region 23 in which the shallow first potential valley PW1 is scheduled to be formed, only one time (only the impurity concentration $n_1$). After preparing a ion-implantation mask for selectively implanting impurity ions with impurity concentration $n_1$ into a wide area that includes both of the buried region 23 and the accumulation region 24 on the plan view in FIG. 2 and a ion-implantation mask for selectively implanting impurity ions with impurity concentration $n_2$ into a narrow area implemented by only the accumulation region 24, by ion implantations with the mask-alignment process, an area into which the ions are selectively implanted only one time and an area into which the ions are selectively implanted two times can be defined, and the impurity concentration distribution of the staircase pattern may be achieved.

When the wavelength used in the solid-state imaging device pertaining to the first embodiment is long and electrons generated in the deep portion of the semiconductor region 21 are returned back to the surface by diffusion, the block layer 25 can block a part of electrons from being captured in the accumulation region 24. Consequently, even if the wavelength of the use light, for example, such as near-infrared light and the like, is long, it is possible to suppress the influence, in which electrons generated in the deep portion of the semiconductor region 21 are returned back to the surface by the diffusion, on the modulation performance of the transferring to the accumulation region 24 of the generated electrons caused by the potential control of the extraction-gate electrode 31.

Figure 4:
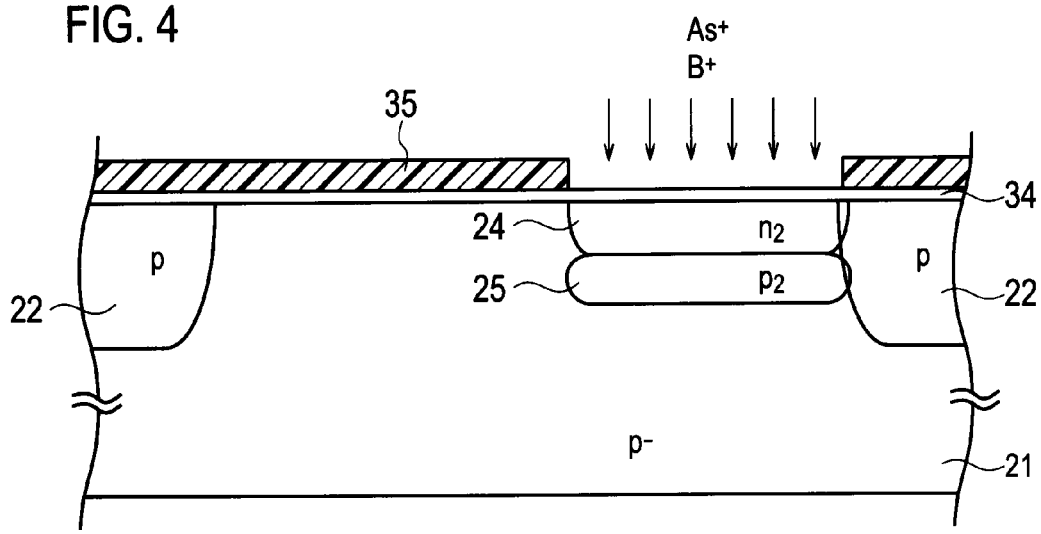
FIG. 4 is a schematic cross-sectional view describing a manufacturing method of the semiconductor element pertaining to the first embodiment.

As illustrated in FIG. 4, the accumulation region 24 and the block layer 25 are delineated through masking the semiconductor region 21 with photo-resist films and sequentially implanting, for example, boron ions ($^{11}$B$^+$) forming the semiconductor region of p-type and arsenic ions ($^{75}$As$^+$) forming the semiconductor region of n-type. The boron ions ($^{11}$B$^+$) are deeply implanted forming the block layer 25, and the arsenic ions ($^{75}$As$^+$) are shallowly implanted forming the accumulation region 24. As the acceleration voltage of the ion implantation is higher, the ions can be deeply implanted, but, in the case of the same acceleration voltage, boron ions with lighter mass are deeply implanted than arsenic ions. Because a single kind of mask is employed for forming the accumulation region 24 and the block layer 25, it is possible to protect the creation of the potential barrier caused by the mask displacement between the photoresist films. Also, because the poor transferring of charges caused by the potential barrier can be removed, the transferring speed can be made higher.

In the plan view illustrated in FIG. 2, the shape of the buried region 23 is bent at upward two portions, extending toward the right side, respectively, so as to form the shape of the capital letter F. Each of the two bent portions extending toward the right side is delineated into a stripe having a recess. Namely, the width of each of the stripes, extending toward the right side, decreases toward the right side in a staircase pattern. As illustrated in FIG. 2, a part of the planar pattern of the buried region 23 is bifurcated into a plurality of narrow stripe lines, each of the narrow stripe lines confronts to the opposite narrow stripe line. Consequently, it is possible to easily deplete the semiconductor region 21 between the narrow stripe lines. With the stripe-shaped pattern having the geometry of the capital letter F, a light receiving area can be enlarged, and the potential at the bottom of the first potential valley PW1 (the potential when the semiconductor region 21 is depleted) can be effectively made higher than the bottom of the second potential valley PW2, and the signal charges can be perfectly transferred from the first potential valley PW1 to the second potential valley PW2. FIG. 2 illustrates the two long narrow bands each having the recess at the upper right side, so as to form the shape of the capital letter F, the topology illustrated in FIG. 2 is mere example, and three or more long narrow bands may be used. In FIG. 2, the extraction-gate electrode 31 is allocated on only one side of the buried region 23 at a site being adjacent to a part of the left edge of the buried region 23, and the extraction region 27 is allocated at the left side of the buried region 23 through the extraction-gate electrode 31 in a topology such that the extraction region 27 protrudes from a part of the extraction-gate electrode 31 toward the left side. In the lower portion of FIG. 2, the accumulation region 24 and the block layer 25 are allocated partially overlapping with the buried region 23. Since the accumulation region 24 and the block layer 25 are delineated by using the same mask, the positions of the accumulation region 24 and the block layer 25 are coincident in the plan view illustrated in FIG. 2.

The extraction region 27 and the extraction-gate electrode 31 are connected to each other through a surface wiring whose illustration is omitted. Because the pining layer 26 is formed on the buried region 23, focusing attention on the top layer of the semiconductor region 21, the extraction-gate electrode 31 is allocated above the semiconductor region 21 between the pining layer 26 and the extraction region 27. Moreover, the read-out gate electrode 32 is allocated between the pining layer 26 and the read-out region 28.

As illustrated in FIGS. 2 and 3 (a), when charges are extracted from the buried region 23, the edge of the extraction region 27, serving as a main surface of a charge-entrance surface, confronts in parallel to the edge of the buried region 23 on the planar pattern, just under the extraction-gate electrode 31. Then, because the extraction-gate electrode 31 allocated on only one side of the buried region 23 is being arranged to overlap with and lie adjacent to a part of the buried region 23, when the potential gradient changing means (31, 33) are used to change the potential profile (potential gradient), the electric field toward the extraction region 27 can be generated in the semiconductor region 21 just under the extraction-gate electrode 31, in the entire portion opposite to the extraction region 27 in the buried region 23. Hence, in the semiconductor element pertaining to the first embodiment, it is possible to improve the extraction efficiency to the extraction region 27 of electrons, and the speed can be made higher when the signal charges are transferred from the buried region 23 to the accumulation region 24, and the structure of the pixel can be simplified.

As illustrated in the plan view in FIG. 2, so as to surround the buried region 23, the accumulation region 24, the read-out region 28 and the extraction region 27, a well region (p-well) 22 of the first conductivity type is formed outside an area illustrated by the dashed line. A thick solid line 30 that surrounds the pinning layer 26 located outer than the dashed line indicates the boundary of an element isolation region. That is, the outside of the thick solid line illustrated in FIG. 2 is the area of an element isolation insulation film formed by using LOCOS method or STI method and the like.

For example, when a high voltage (positive voltage) as the control signal TXD is applied to the extraction-gate electrode 31 connected to the extraction region 27, a gradient of the depleted potential is generated from the buried region 23 to the extraction region 27, as illustrated in FIG. 3 (c). With the electric field caused by the potential distribution having the gradient illustrated in FIG. 3 (c), most of electrons generated in the buried region 23 are extracted to the extraction region 27. Consequently, electrons are not transferred to the accumulation region 24.

On the other hand, when a low voltage (0V or a negative voltage of about −1V) as the control signal TXD is applied to the extraction-gate electrode 31, as illustrated in FIG. 3 (b), the potential barrier against electrons is created between the buried region 23 and the extraction region 27, and the gradient of the depleted potential is created from the buried region 23 to the accumulation region 24. Thus, the extraction of electrons from the buried region 23 to the extraction region 27 is blocked off. Hence, with the electric field caused by the potential distribution illustrated in FIG. 3 (b), most of electrons (charges) generated in the buried region 23 are transferred to the accumulation region 24.

As mentioned above, without any establishment of a special gate structure between the buried region 23 and the accumulation region 24, only by controlling the potential of the extraction-gate electrode 31 provided on only one side of the buried region 23, it is possible to modulate the accumulated-charge quantity (or the accumulation state) to the accumulation region 24 of electrons generated by the light. Also, when the low voltage as the control signal TXD is applied to the extraction-gate electrode 31, because the gradient of the depleted potential is generated from the buried region 23 to the accumulation region 24, it is possible to achieve the perfect transferring of charges from the buried region 23 to the accumulation region 24. The perfect transferring facilitates the protection of image lag and enables the protection of the generation of random noise caused by the remnant charges.

In this way, according to the solid-state imaging device pertaining to the first embodiment, because the extraction-gate electrode 31 serving as the potential gradient changing means (31, 33) is allocated on only one side of the buried region 23, the transferring/non-transferring of the signal charges to the accumulation region 24 can be controlled only by controlling the potential of the extraction-gate electrode 31, and, differently from the case of the structure disclosed in PTL 3, there is no trouble that the potential gradient becomes zero at the vicinity of the center on the transferring-path of charges. Also, since the potential gradient can be created in the overall width of the charge-transferring route, the structure of the pixel is simplified, and the transfer efficiency of charges is made high, and therefore a high resolution and a high-speed operation can be achieved. Also, because a gate structure and a switch do not exist on the charge-transferring route from the buried region 23 to the accumulation region 24, when electrons travel under the gate electrode, electrons are not trapped on the silicon/oxide film boundary (Si—SiO$_2$ boundary), and the high-speed transfer is facilitated, thereby improving a temporal resolution. Moreover, because the buried region 23 and the accumulation region 24 are organized as one buried photodiode, the structure is advantageous from the standpoint of the suppression of the noise, such as dark current noise, transfer noise and the like. Moreover, because the block layer 25 is formed below the accumulation region 24, it is possible to suppress the influence against the modulation performance of the transferring to the accumulation region 24 of the generated electrons, caused by the potential control of the extraction-gate electrode 31, in which electrons generated in the deep portion of the semiconductor region 21 are returned back to the surface by the diffusion.

On the other hand, the read-out gate electrode 32 statically controls the potential of the transfer channel through the gate insulation film 30. For example, when the low voltage (0V or the negative voltage) as the control signal TXD is applied to the read-out gate electrode 32, because the potential barrier against electrons is created between the accumulation region 24 and the read-out region 28, charges are not transferred from the accumulation region 24 to the read-out region 28. On the other hand, when the high voltage (positive voltage) as the control signal TXD is applied to the read-out gate electrode 32, because the height of the potential barrier between the accumulation region 24 and the read-out region 28 is decreased or extinguished, charges are transferred from the accumulation region 24 to the read-out region 28.

As illustrated in FIG. 3 (a), a gate electrode of a signal-read-out transistor (amplification transistor) TA$_{ij}$ implementing a read-out-buffer amplifier is connected to the read-out region 28. A drain electrode of the signal-read-out transistor TA$_{ij}$ is connected to a power supply VDD, and a source electrode of the signal-read-out transistor TA$_{ij}$ is connected to a drain electrode of a switching transistor TS$_{ij}$ for pixel selection. A source electrode of the switching transistor TS$_{ij}$ for the pixel selection is connected to a vertical signal line B$_j$, and control signal S(i) for selecting a horizontal line is applied to the gate electrode of the switching transistor TS$_{ij}$ from the vertical scanning circuit 3. When the control signal S(i) for selecting is set to high (H) level, the switching transistor TS$_{ij}$ is turned on, and a current, which is amplified by the signal read transistor TA$_{ij}$ and corresponds to the potential of the read-out region 28, flows through the vertical signal line B$_j$. Moreover, a source electrode of a reset transistor TR$_{ij}$ implementing the read-out-buffer amplifier is connected to the read-out region 28. A drain electrode of the reset transistor TR$_{ij}$ is connected to the power supply VDD, and reset signal R(i) is applied to the gate electrode of the reset transistor TR$_{ij}$. By setting the reset signal R(i) to the high (H) level, the reset transistor TR$_{ij}$ extracts charges accumulated in the read-out region 28 and resets the read-out region 28.

The semiconductor region 21 preferably has the impurity concentration of about $5 \times 10^{12}$ cm$^{-3}$ or more and about $5 \times 10^{16}$ cm$^{-3}$ or less. As illustrated in FIGS. 3 (b) and 3 (c), in such a way that a potential of the bottom of a potential valley for majority carriers in the accumulation region 24 is deeper than a potential of the bottom of a potential valley created by the buried region 23, the impurity concentration of the accumulation region 24 is set to be higher than that of the buried region 23. For example, the buried region 23 has the impurity concentration of about $1 \times 10^{17}$ cm$^{-3}$ or more and about $8 \times 10^{18}$ cm$^{-3}$ or less, and preferably has the impurity concentration of about $2 \times 10^{17}$ cm$^{-3}$ or more and about $1 \times 10^{18}$ cm$^{-3}$ or less. Typically, for example, it is possible to employ a value of about $8 \times 10^{17}$ cm$^{-3}$ at which the depletion is relatively easy. Its thickness can be set between about 0.1 and 3 micrometer, preferably between about 0.1 and 0.3 micrometer. On the other hand, the accumulation region 24 has the impurity concentration of about $1 \times 10^{17}$ cm$^{-3}$ or more and about $8 \times 10^{18}$ cm$^{-3}$ or less and preferably has the impurity concentration of about $4 \times 10^{17}$ cm$^{-3}$ or more and about $2 \times 10^{18}$ cm$^{-3}$ or less. Typically, for example, a value of about $6 \times 10^{18}$ cm$^{-3}$ can be employed. Its thickness can be set between about 0.1 micrometer and 3 micrometers and preferably between about 0.1 and 0.3 micrometer. When the impurity concentration of the accumulation region 24 is set to about 1.2 to 5 times the impurity concentration of the buried region 23, preferably, about 1.5 to 2.5 times, the potential of the bottom of the potential valley of the accumulation region 24 is properly deeper than the potential of the bottom of the potential valley created by the buried region 23.

When the gate insulation film 33 is made of thermal oxide film, the thickness of the thermal oxide film may be set to about 150 nanometers or more and about 1000 nanometers or less, preferably, about 200 nanometers or more and 400 nanometers or less. When the gate insulation film 33 is made of dielectric film other than the thermal oxide film, an equivalent thickness converted with respect to a relative dielectric constant $\in_r$ (at 1 MHz, $\in_r=3.8$) of the thermal oxide film may be defined. For example, when a CVD oxide film having a relative dielectric constant $\in_r=4.4$ is used, a thickness in which the above thickness is multiplied by 1.16 (=4.4/3.8) may be employed, and when a silicon nitride (Si$_3$N$_4$) film having a relative dielectric constant $\in_r=7$ is used in the gate insulation film 33, a thickness in which the above thickness is multiplied by 1.84 (=7/3.8) may be employed. However, because the oxide film (SiO$_2$ film) produced by the standard CMOS technique is preferred to be used in the gate insulation film 33, the field oxide film in the CMOS technique shall be used as the gate insulation film 33, for simplifying the manufacturing steps.

As illustrated in FIG. 3 (a), an opening 42 of a light shielding film 41 is selectively provided such that the generation of optical charges is carried out in the semiconductor region 21 just under the buried region 23 implementing the photodiode D1. FIG. 3 (a) illustrates only the gate insulation film 33. However, the light shielding film 41 may be made of metallic thin film, such as aluminum (Al) and the like, which is provided on any upper portion inside a plurality of interlayer insulation films for forming a multilevel wiring structure whose illustration is omitted.

<Operation of Solid-State Imaging Device: Range Image Sensor>

The application of the lock-in pixel whose outline configuration is illustrated in FIGS. 2 and 3 (a) will be described below. That is, the light irradiated as a repetitive pulse signal of a pulse width T$_0$ from a light source is reflected by a target and entered through a lens to the respective pixels X$_{11}$ to X$_{1m}$; X$_{21}$ to X$_{2m}$; - - - ; and X$_{n1}$ to X$_{nm}$ in the solid-state imaging device (two-dimensional image sensor) illustrated in FIG. 1. That is, as illustrated in FIG. 3 (a), the light is entered through the openings 42 of the light shielding films 41 in the respective pixels X$_{11}$ to X$_{1m}$; X$_{21}$ to X$_{2m}$; - - - ; and X$_{n1}$ to X$_{nm}$ to the photodiodes D1 of the respective pixels X$_{11}$ to X$_{1m}$; X$_{21}$ to X$_{2m}$; - - - ; and X$_{n1}$ to X$_{nm}$. The photodiode D1 receives the pulsed light of the pulse width T$_0$ entered through the opening 42 of the light shielding film as an optical signal and converts the optical signal into charges. Here, as illustrated in the timing diagram illustrated in FIG. 5, the high voltage (positive voltage) as the control signal TXD is applied to the extraction-gate electrode 31 provided on only one side of the buried region 23, at timing when the optical pulse having a pulse width $T_0$ is received.

As described already, when the high voltage (positive voltage) as the control signal TXD is applied to the extraction-gate electrode 31, with the electric field caused by the potential distribution having the gradient illustrated in FIG. 3 (c), most of electrons generated in the buried region 23 are extracted to the extraction region 27. On the other hand, when the low voltage (0V, or the negative voltage of about −1V) as the control signal TXD is applied to the extraction-gate electrode 31, with the potential distribution illustrated in FIG. 3 (b), most of electrons (charges) generated in the buried region 23 are transferred to the accumulation region 24.

Figure 5:
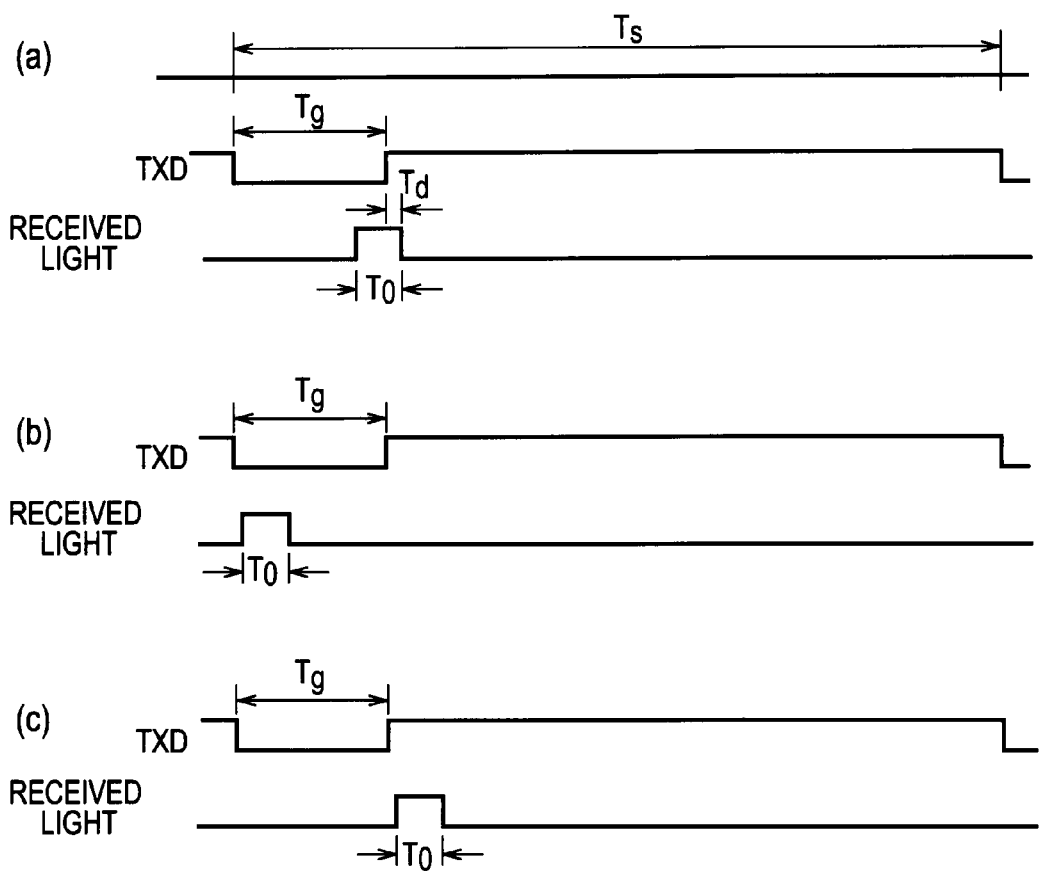
FIG. 5 is a timing chart describing a reading-out method of the solid-state imaging device pertaining to the first embodiment in which a repetition cycle of control signal TXD applied to an extraction-gate electrode is used as a base.

At first, as illustrated in FIG. 5 (a), when the received optical pulse having a pulse width $T_0$ is irradiated at a delayed timing, being delayed of a delay time $T_d$ from the rising edge of the control signal TXD applied to the extraction-gate electrode 31, charges $Q_1$, which are generated in the buried region 23 by the optical pulse and accumulated in the accumulation region 24, are given by:

$$Q_1 = I_p(T_0 - T_d) + Q_B + Q_{SR}. \quad (1)$$

Here, $I_p$ indicates an optical current generated by the received optical pulse, $Q_B$ indicates charges generated by background light, and $Q_{SR}$ indicates the components, which are slow in response speed and act as offset charges in the buried region 23, among charges generated by the received optical pulse.

In FIG. 5 (b), in a range targeted for measurement, because the timing of the optical pulse is so set that all of the charges, generated in the buried region 23 by the received optical pulse having a pulse width $T_0$, can be accumulated in the accumulation region 24, the accumulated charges $Q_2$ are represented by:

$$Q_2 = I_p T_o + Q_B + Q_{SR}. \quad (2)$$

In FIG. 5 (c), because the timing of the optical pulse is so set that all of the components generated in the buried region 23 by the received optical pulse can be extracted to the extraction region 27, the component $Q_{SR}$ of the offset charges that are slow in the response speed and the component $Q_B$ resulting from the background light are captured so as to be accumulated in the accumulation region 24, and the accumulated charges are represented by the following Eq. (3);

$$Q_3 = Q_B + Q_{SR}. \quad (3)$$

From Eq. (3), the delay time $T_d$ of the optical pulse is understood to be able to be determined by canceling the component $Q_B$ resulting from the background light included in Eqs. (1) and (2) and the component $Q_{SR}$ of the offset charges that are slow in the response speed, among the components of charges. That is, because the delay time $T_d$ of the optical pulse can be determined by the following Eq. (4):

$$T_d = T_0(Q_2 - Q_1)/(Q_2 - Q_3), \quad (4)$$

distance L from the target is determined by using light speed c, by the following Eq. (5):

$$L = (c/2)T_d = (c/2)T_0(Q_2 - Q_1)/(Q_2 - Q_3). \quad (5)$$

Actually, by defining the repetition period $T_S$ of the control signal TXD applied to the extraction-gate electrode 31 illustrated in FIG. 5 as one cycle, after the cycles are repeated many times so that a sufficient number of electrons are accumulated in the accumulation region 24, the signals of the respective pixels are read out to the outside of the image sensor. The series of the repetitive operations are sequentially performed for FIGS. 5 (a), 5 (b) and 5 (c), respectively, and, on the basis of the signal voltages proportional to the respective read-out charge quantities or the digital values proportional to the signal voltages, the distance is determined by carrying out the process corresponding to Eq. (5), through arithmetic operations in digital region.

Figure 6:
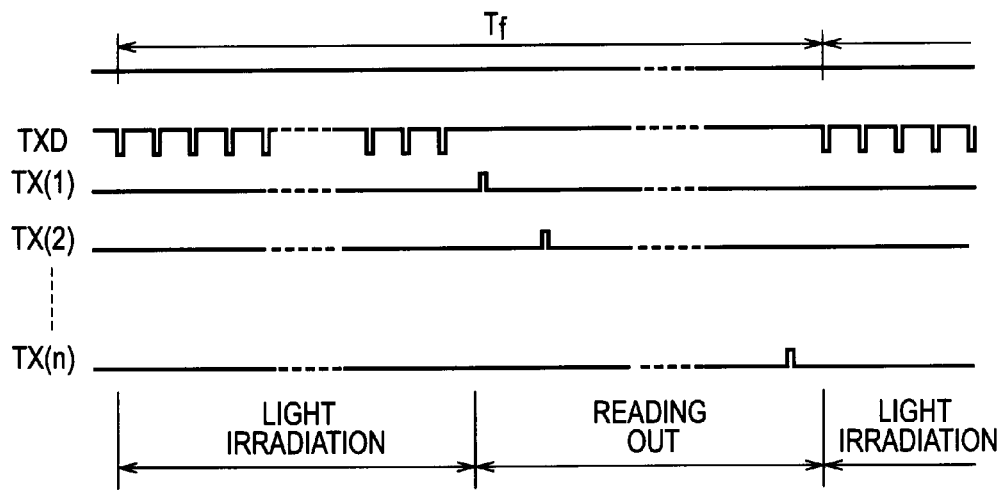
FIG. 6 is a timing chart describing the reading-out method of the solid-state imaging device pertaining to the first embodiment, with regard to one frame.

FIG. 6 illustrates an example of the read-out timing of the actual image sensor. In the solid-state imaging device (two-dimensional image sensor) illustrated in FIG. 1, the control signal TXD common to all of the pixels is applied to the extraction-gate electrode 31 in FIGS. 2 and 3 (a), and the pixels are operated at the same timing. Alternatively, for example, signals that are different in timing for each row are applied, and the signals of different timings may be applied in linkage to the reading-out operation. As illustrated in FIG. 6, in a period of "light irradiation", by repeatedly applying the control signal TXD to the extraction-gate electrode 31 many times in the repetition period $T_S$, the extractions of charges to the extraction region 27 of charges and the transferring of charges to the accumulation region 24 are repeated, so as to accumulate the sufficient number of electrons in the accumulation region 24. After that, in a period of "reading-out", by sequentially applying the control signals TX(1), - - - , TX(i), - - - , TX(n−2), TX(n−1) and TX(n) to the extraction-gate electrodes 31 on the respective rows from the vertical scanning circuit 3 in the pixel array 1 illustrated in FIG. 1, as illustrated in FIG. 6, the signal electrons in the accumulation region 24 are read out. Because the method of reading out the signal to the outside of the image sensor does not differ from the CMOS image sensor of the charge transfer type that uses the conventional buried photodiode, the detailed explanation is omitted. FIG. 6 illustrates only the timing of the TX signal applied to each row, in the reading-out period.

According to the solid-state imaging device pertaining to the first embodiment, when charges are detected synchronously with the modulated optical signal, because the charge-transferring route for signal detection is one, it is possible to achieve the range image sensor in which the variation in characteristics for each pixel is reduced, for example, as compared with the conventional structure in which charges are distributed to the plurality of accumulation regions 24 through gate electrode structures from the photodiode. Also, according to the solid-state imaging device pertaining to the first embodiment, because the extraction-gate electrode 31 serving as the potential gradient changing means (31, 33) is allocated on only one side of the buried region 23, and because, by controlling only the potential of the extraction-gate electrode 31, the transferring/non-transferring of the signal charges to the accumulation region 24 can be selected, differently from the case of the structure disclosed in PTL 3, there is no trouble that the potential gradient becomes zero at the vicinity of the center on the transferring-path of charges.

<Operation of Solid-State Imaging Device: Measurement of Fluorescent Intensity and Life of Fluorescence>

As specific application of the solid-state imaging device pertaining to the first embodiment of the present invention, a method of imaging the life of fluorescence of the target will be described below. The measurement of the fluorescence life is useful in bioimaging. If the measurement can be achieved by using a semiconductor device, a simple light source and an optical system, it is possible to enlarge the application range of the life measurement of the fluorescence.

Figure 7:
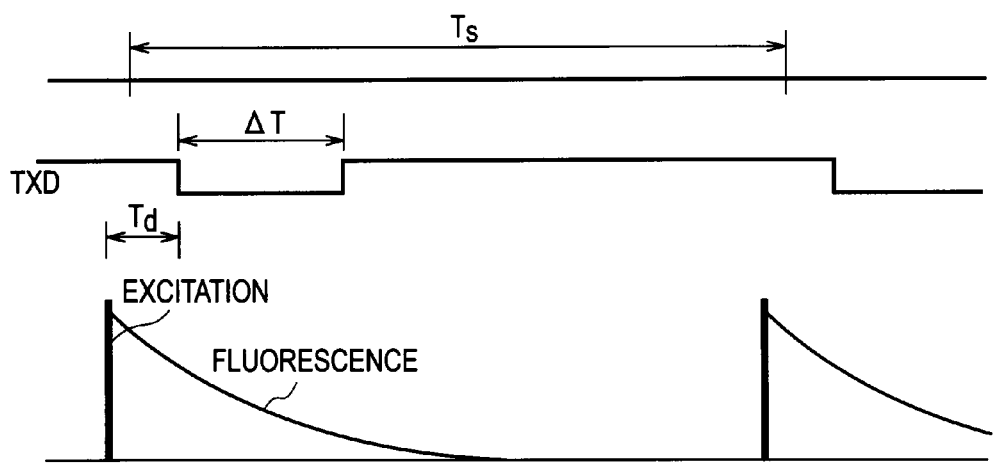
FIG. 7 is a timing diagram when the solid-state imaging device pertaining to the first embodiment is used to measure a life of fluorescence.

FIG. 7 illustrates the timing diagram in a case of reducing a period $T_g$ in which the low voltage (0V, or the negative voltage of about −1V) as the control signal TXD is applied to the extraction-gate electrode 31 and changing the timing $T_d$ of the pulse for each frame and consequently measuring the life of fluorescence. In a period except the period $\Delta T$, the high voltage as the control signal TXD is applied to the extraction-gate electrode 31, and charges in the buried region 23 are extracted to the extraction region 27. When an excitation light of a repetition pulse is irradiated to the target, the fluorescence from the target lags.

Because the fluorescence is exponentially attenuated, when the fluorescent intensity is defined as P, a relation between the fluorescence P and a time T can be represented by Eq. (6), with τ being defined as the life of fluorescence, and $P_0$ being defined as the initial value of the fluorescent intensity:

$$P = P_0 \exp(-t/\tau). \tag{6}$$

In FIG. 7, in a period ΔT from the timing $T_d = t_1$, when the low voltage as the control signal TXD is applied to the extraction-gate electrode 31 so that charges generated by fluorescence are transferred to the accumulation region 24, if the delay time in the transfer of the fluorescent charges is ignored, the transferred charges $Q_1$ are given by the integration in a period between the time $t_1$ and $t_1 + \Delta T$, as represented by Eq. (7):

$$Q_1 = k \int_{t_1}^{t_1 + \Delta T} P_0 \exp(-t/\tau) dt \tag{7}$$
$$= k P_0 \tau \exp(-t_1/\tau)(1 - \exp(-\Delta T/\tau))$$

The transferring operation to the accumulation region 24 is repeated many times. Here, if we assume that the same fluorescence is repeated with the identical life of fluorescence, charges are increased to N times by the N repetitions.

Figure 11:
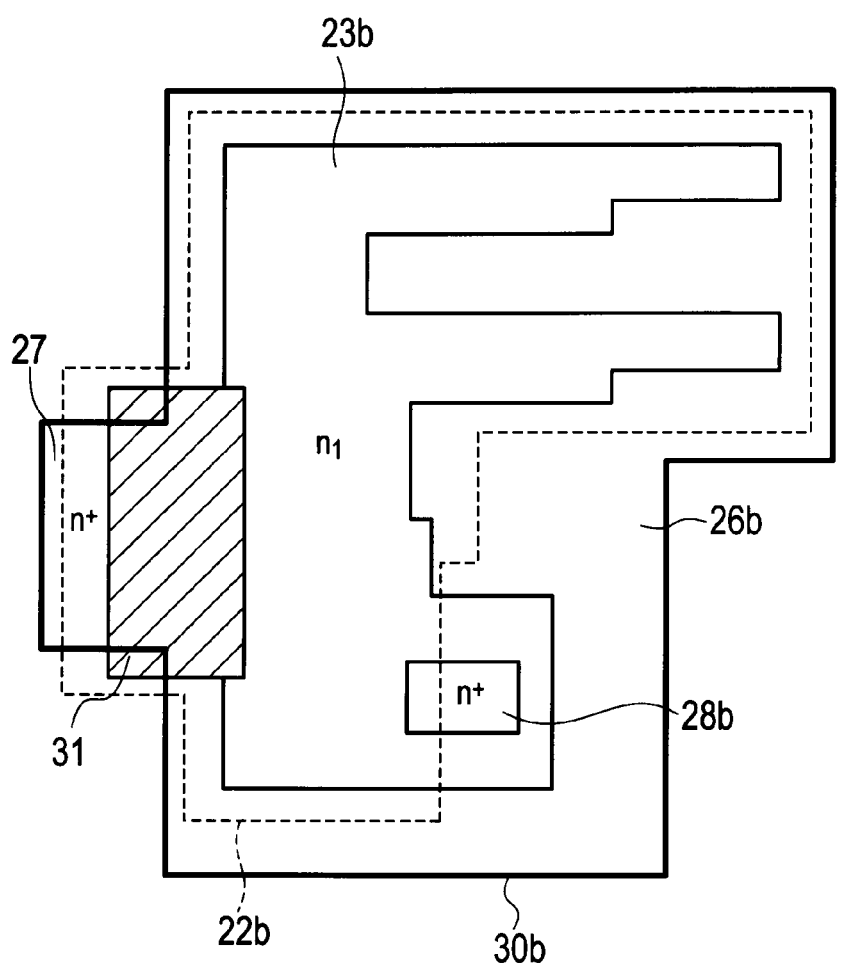
FIG. 11 is a schematic plan view describing a configuration of a semiconductor element that serves as a part of pixels of a solid-state imaging device pertaining to a third embodiment of the present invention.

Similarly, in FIG. 11, in the period ΔT from a timing $T_d = t_2$ differing from the time $t_1$, when the low voltage as the control signal TXD is applied to the extraction-gate electrode 31 so that charges generated by fluorescence are transferred to the accumulation region 24, if the delay time in the transfer of the fluorescent charges is ignored, the transferred charges $Q_2$ are given by the integration in a period between the time $t_2$ and $t_2 + \Delta T$, as represented by Eq. (8):

$$Q_2 = k \int_{t_2}^{t_2 + \Delta T} P_0 \exp(-t/\tau) dt \tag{8}$$
$$= k P_0 \tau \exp(-t_2/\tau)(1 - \exp(-\Delta T/\tau))$$

From Eqs. (7) and (8), the life τ of the fluorescence can be represented by the following Eq. (9):

$$\tau = (t_2 - t_1)/\ln(Q_1/Q_2). \tag{9}$$

Thus, the life τ of the fluorescence can be measured by reading out charges generated by fluorescence at different timings. Meanwhile, because the entire reading-out operation as the image sensor is substantially similar to the operation described by using FIG. 6, the duplicative descriptions are omitted.

According to the solid-state imaging device pertaining to the first embodiment, because there is no trouble that the potential gradient becomes zero at the vicinity of the center on the transferring-path of charges, differently from the case of the structure disclosed in PTL 3, and the potential gradient can be created in the overall width of the carrier transfer route, and furthermore, when charges are detected synchronously with the modulated optical signal, because the charge-transferring route for signal detection is one, it is possible to image the life of fluorescence, while the variation in the property for each pixel is reduced, for example, as compared with the conventional structure in which charges are distributed to the plurality of accumulation regions 24 through the gate electrode structures from the photodiode.

The timing diagram illustrated in FIG. 7 can be used not only in the case of measuring the life of fluorescence, but also in the case of measuring the intensity of the fluorescent. The measurement of the intensity of the fluorescent may be carried out by merely setting the time window and discarding (exhausting) the component of the excitation light and then transferring only when the fluorescence is generated. Although the timing of the time window is fixed, because the fluorescence is desired to be collected as much as possible, just after the excitation light, the time window begins to be opened, and, the time window is kept wide so as to achieve a sufficient attenuation, namely, the ΔT is made great.

Thus, in the case of the fluorescent intensity imaging, the time window ΔT is fixed, and after charges resulting from the excitation light are sufficiently extracted, a discharge gate is closed, only charges generated by fluorescence are transferred to the charge accumulation portion. In the fluorescent intensity imaging of the earlier technology, when the component resulting from the excitation light and the component resulting from the fluorescence are separated, only an optical filter is used which uses the situation that their wavelengths are different and performs a selection on the wavelength of the light. However, there is a case that the excitation light cannot be always sufficiently separated from the fluorescence in the earlier fluorescent intensity imaging, because the wavelength components of the excitation light and the fluorescence partially overlap with each other. As described in the present invention, because the selection through the time window can improve the separation characteristic, the smaller fluorescence can be detected.

Second Embodiment

In the pixel in the solid-state imaging device pertaining to the first embodiment, by controlling the potential of the read-out gate electrode 32, charges accumulated in the accumulation region 24 are transferred to the read-out region 28. However, as illustrated in a plan view in FIG. 8, by designing a semiconductor element serving as a part of the pixel $X_{ij}$ in the solid-state imaging device such that the read-out region 28a is allocated in the inside of a buried region 23a, and furthermore in the inside of an accumulation region 24a, without providing the read-out gate electrode, charges accumulated in the accumulation region 24a can be directly transferred to the read-out region 28.

Figure 8:
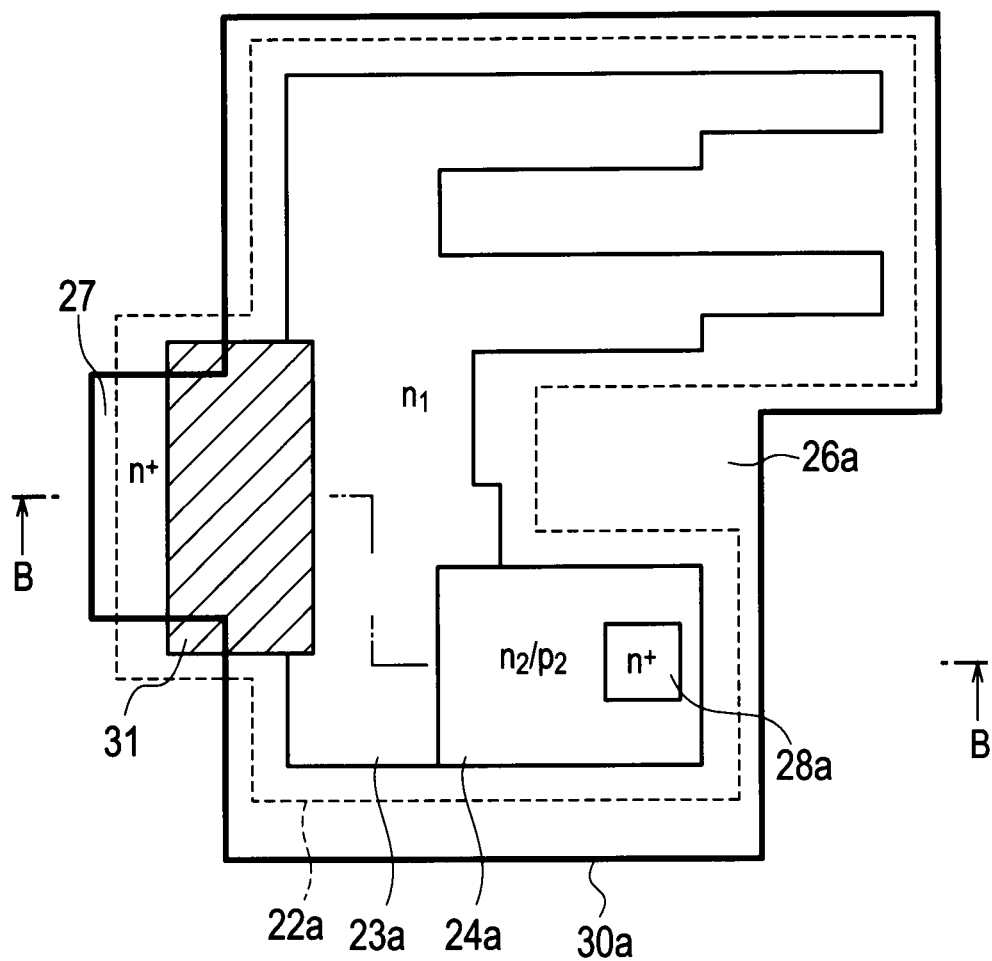
FIG. 8 is a schematic plan view describing a configuration of a semiconductor element that serves as a part of pixels in a solid-state imaging device pertaining to a second embodiment of the present invention.
Figure 9:
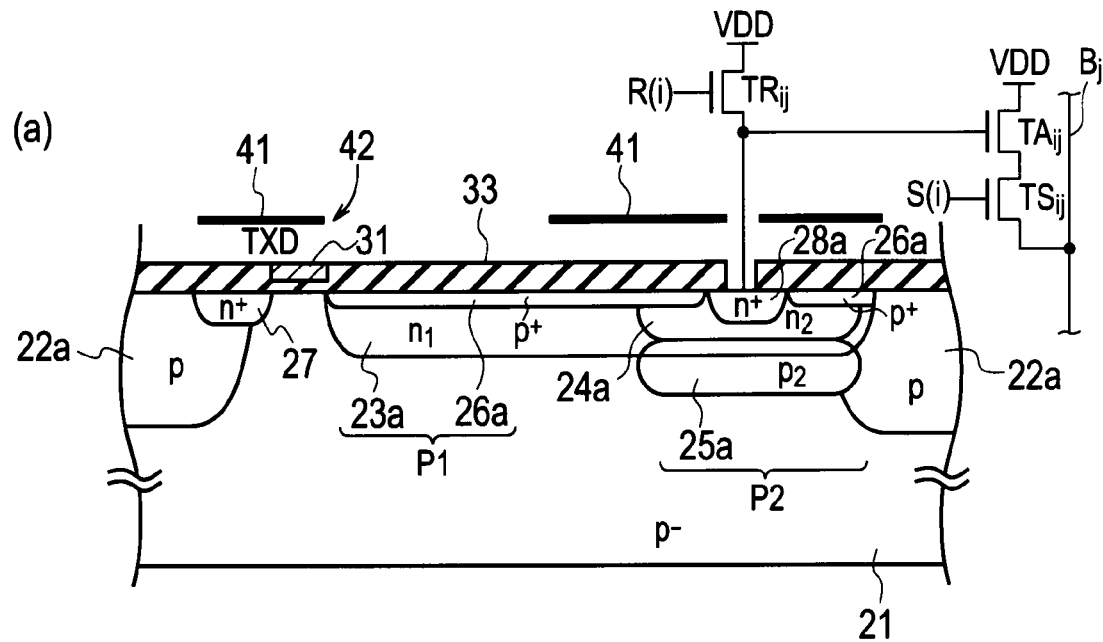
FIG. 9 (a) is a schematic cross-sectional view when viewed from a B-B direction in FIG. 8.
Figure 9:
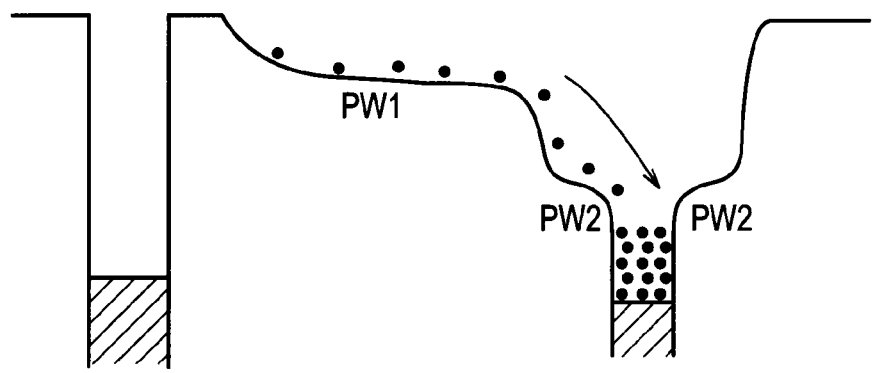
Figure 9:
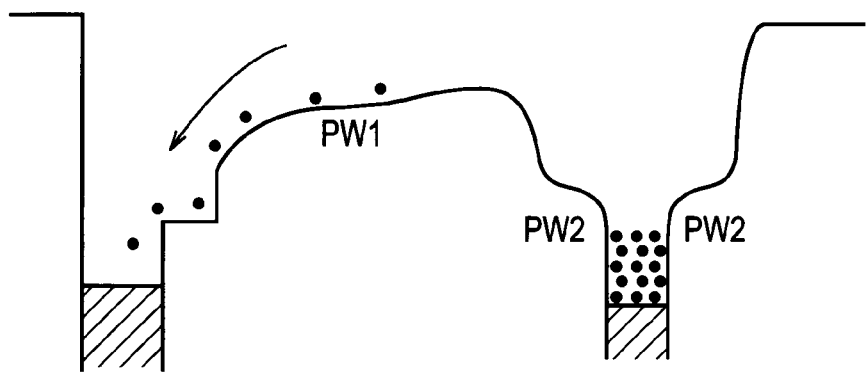

As FIG. 9 (a) illustrates a step-formed cross-sectional view taken from B-B direction in FIG. 8, the pixel (semiconductor element) in a solid-state imaging device pertaining to a second embodiment of the present invention encompasses a semiconductor region 21 of the first conductivity type (p-type); a buried region (light receiving cathode region) 23a of the second conductivity type (n-type) that is buried in a part of the upper portion of the semiconductor region 21 and serves as the photodiode together with the semiconductor region 21; an extraction region 27 of the second conductivity type ($n^+$-type) that is separated from the buried region 23a and provided in a part of the semiconductor region 21 and extracts charges generated by the photodiode from the buried region 23a at a particular timing, having higher impurity concentration than the buried region 23a; a read-out region 28a of the second conductivity type ($n^+$-type) that is provided in a part of the semiconductor region 21 and accumulates charges, which are transferred from the buried region 23a when charges are not extracted, until charges are read out and is higher in impurity concentration than the buried region 23a; and a potential gradient changing means (31, 32) that are provided in the upper portion of the channel provided in the semiconductor region 21 between the buried region 23a and the extraction region 27 and controls the potential of the channel and changes at least a part of a potential gradient of a potential profile from the buried region 23a to the read-out region 28a, the potential gradient of the potential profile from the buried region 23a to the extraction region 27 controls at least a part of the transferring of charges and the extraction of charges. The pixel (semiconductor element) in the solid-state imaging device pertaining to the second embodiment of the present invention further includes an accumulation region 24a of the second conductivity type (n-type), which is provided continuously to the read-out region 28a, surrounding the read-out region 28a, the accumulation region 24a creates a potential valley deeper than a potential of the bottom of a potential valley created by the buried region 23a for majority carriers in the buried region 23a and shallower than a depth of a potential well for majority carriers created by the read-out region 28a (see FIGS. 9 (b) and 9 (c)). The potential gradient changing means (31, 32) create a potential gradient gradually decreasing from the buried region 23a to the accumulation region 24a at timing when charges are scheduled to be transferred, and transfers charges from the buried region 23a to the accumulation region 24a. In the plan view in FIG. 8, although the read-out region 28a is provided in the inside of the buried region 23a, because the read-out region 28a is not required to be perfectly included in the inside of the buried region 23a, the read-out region 28a may be provided continuously to the buried region 23a or may be provided while at least a part of the read-out region 28a overlaps with the buried region 23a.

As illustrated in FIG. 9 (a), the opening 42 of the light shielding 41 is provided such that light is selectively irradiated to the buried region 23a. Since the opening 42 of the light shielding 41 is provided, the optical charges are generated in the semiconductor region 21 just under the buried region 23a implementing the photodiode D1. Although FIG. 9 (a) illustrates only the gate insulation film 33, the situation that the light shielding film 41 may be made of the metallic thin film, such as aluminum (Al) and the like, which is provided on any upper portion inside the plurality of inter-layer insulation films for forming the multilevel wiring structure, whose illustration is omitted, is similar to the solid-state imaging device pertaining to the first embodiment.

Similarly to the solid-state imaging device pertaining to the first embodiment, the pixel (semiconductor element) in the solid-state imaging device pertaining to the second embodiment of the present invention further includes a block layer 25a of the first conductivity type (p$^+$-type) that is provided below the accumulation region 24a and is higher in impurity concentration than the semiconductor region 21; and a pining layer 26a of the first conductivity type (p$^+$-type) that is provided from a site on the buried region 23a to a site on the accumulation region 24a. Then, as illustrated by the dashed line in FIG. 8, so as to surround the pining layer 26a, the buried region 23a below the pining layer 26a, the extraction region 27 and the accumulation region 24a, the well region (p-well) 22 of the first conductivity type is formed which is higher in impurity concentration than the semiconductor region 21. A thick solid line 30a surrounding the pinning layer 26a, located outer than the dashed line, indicates the boundary of the element isolation region. That is, the outside of the thick solid line 30a illustrated in FIG. 8 is the region of the element isolation insulation film formed by using the LOCOS method or the STI method or the like.

Although the pixel (semiconductor element) in the solid-state imaging device pertaining to the second embodiment does not have the read-out gate electrode, on the gate insulation film 33, the extraction-gate electrode 31, which controls the potential of the extraction channel formed between the buried region 23a and the extraction region 27 and transfers electrons generated by the buried region 23a, from the buried region 23a to the extraction region 27, is arranged on only one side of the buried region 23a. The gate insulation film 33 and the extraction-gate electrode 31 on the gate insulation film 33 implement the potential gradient changing means (31, 33), which control the potential of the channel formed on the upper portion of the semiconductor region 21 between the buried region 23a and the extraction region 27, and change the potential profile (potential gradient), and then control the extraction/non-extraction of charges from the buried region 23a to the extraction region 27 and the transferring/non-transferring of the signal charges from the buried region 23a to the accumulation region 24a.

FIGS. 9 (b) and 9 (c) are the potential diagrams on a horizontal cross-section taken on the step-formed cross-sectional view of FIG. 9 (a), such that the buried region 23a, the accumulation region 24a and the read-out region 28a are cut by the horizontal plane, and charges (electrons) are illustrated by closed circles. As illustrated in FIG. 9 (a), on the left sides of FIGS. 9 (b) and 9 (c), the situation in which electrons at Fermi energy level or less in the potential well in the extraction region 27 are full is indicated by the diagonal hatch with upward oblique lines to the right. Also, a potential valley (first potential valley) PW1 that indicates the position of the conduction band edge of the buried region 23a is represented on the right side of the potential well in the extraction region 27, and a potential valley (second potential valley) PW2 that indicates the position of the conduction band edge of the accumulation region 24a is represented on the right side of the first potential valley PW1. A potential well of the read-out region 28a that is deeper than the bottom of the second potential valley PW2 is indicated on the center of the second potential valley PW2. Because the depth of the potential well in the read-out region 28a shall be assigned as Fermi energy level, in FIGS. 9 (b) and 9 (c), the levels of the top edges of the regions indicated by the diagonal hatch with the upward oblique lines to the right define the depths of the potential wells. At the position above Fermi energy level around the deep potential well that indicates the read-out region 28a, the conduction band edge that indicates the bottom of the second potential valley PW2 shallower than the read-out region 28a is surrounded, and the second potential valley PW2 monotonously continues to the deep potential well created by the read-out region 28a. In such a way that the potential of the bottom of the potential valley for the majority carriers in the accumulation region 24a is deeper than the potential of the bottom of the potential valley created by the buried region 23a and shallower than the depth of the potential well created by the read-out region 28a, the impurity concentration of the accumulation region 24a is set to be higher than the impurity concentration of the buried region 23a and lower than the impurity concentration of the read-out region 28a.

The potential barrier between the first potential valley PW1 and the deep potential well of the extraction region 27 shown on the left side thereof corresponds to the potential distribution of the conduction band edge of the semiconductor region 21 just under the extraction-gate electrode 31. For example, when the low voltage (0V or the negative voltage of about −1V) as the control signal TXD is applied to the extraction-gate electrode 31, as illustrated in FIG. 9 (b), the potential barrier against electrons is created between the buried region 23 and the extraction region 27, and the gradient of the depleted potential is created from the buried region 23 to the accumulation region 24a. With the electric field caused by the potential distribution illustrated in FIG. 9 (b), most of electrons (charges) generated in the buried region 23a are transferred to the accumulation region 24a and further transferred through the second potential valley PW2, which indicates the accumulation region 24a, to the deep potential well in the read-out region 28a.

On the other hand, when the high voltage (positive voltage) as the control signal TXD is applied to the extraction-gate electrode 31 connected to the extraction region 27, as illustrated in FIG. 9 (c), the gradient of the depleted potential is created from the buried region 23a to the deep potential well of the extraction region 27 on the left side. With the electric field caused by the potential distribution as illustrated in FIG. 9 (c), electrons generated in the buried region 23a are extracted to the extraction region 27 and cannot be transferred to the deep potential well in the read-out region 28a.

As illustrated in FIGS. 8 and 9 (a), when charges are extracted from the buried region 23a, the edge of the extraction region 27 serving as the main surface of a charge-entrance surface confronts in parallel to the edge of the buried region 23a, on the planar pattern, just under the extraction-gate electrode 31. Then, because the extraction-gate electrode 31 is arranged to overlap with and lie adjacent to a part of the buried region 23a, when the potential gradient changing means (31, 33) are used to change the potential profile (potential gradient), the electric field toward the extraction region 27 can be generated in the semiconductor region 21 just under the extraction-gate electrode 31, in the entire portion opposite to the extraction region 27 in the buried region 23a. Hence, in the semiconductor element pertaining to the second embodiment, it is possible to improve the extraction efficiency to the extraction region 27 of charges, and it is possible to achieve the high-speed transfer of the signal charges to the read-out region 28a through the accumulation region 24a from the buried region 23a, and it is possible to simplify the structure of the pixel. Moreover, because the read-out gate electrode for transferring charges to the read-out region 28a is omitted, the semiconductor element pertaining to the second embodiment, can simplify the structure of the semiconductor element, can reduce the area of the pixel, which facilitates an image sensor that is operated at a high-speed and a high spatial resolution. However, in the usual reading-out operation, attention should be paid to a fact that a dark current is increased because reset noise is not cancelled and charges are accumulated at the semiconductor surface.

In this way, according to the solid-state imaging device pertaining to the second embodiment, because the extraction-gate electrode 31 is provided on only one side of the buried region 23a, and because the transferring/non-transferring of the signal charges to the accumulation region 24a can be controlled only by controlling the potential of the extraction-gate electrode 31, differently from the case of the structure disclosed in PTL 3, there is no trouble that the potential gradient becomes zero at the vicinity of the center on the transferring-path of charges. Also, according to the solid-state imaging device pertaining to the second embodiment, since the potential gradient can be created in the overall width of the charge-transferring route, the structure of the pixel is simplified, and the transfer efficiency of charges is made high, and therefore a high resolution and a high-speed operation can be achieved.

Third Embodiment

Also, as illustrated in FIGS. 8 and 9, the already-described second embodiment has represented a structure such that the read-out region 28a is located at the vicinity of the center in the surface of the accumulation region 24a, the block layer 25a of the first conductivity type ($p^+$-type), which is higher in impurity concentration than the semiconductor region 21, is provided below the accumulation region 24a, and without any read-out gate electrode, charges accumulated in the accumulation region 24 are directly transferred to the read-out region 28. However, in a semiconductor element serving as a part of the pixel $X_{ij}$ in a solid-state imaging device pertaining to a third embodiment of the present invention, as illustrated in FIG. 11, a layout is employed such that the areas of the accumulation region 24a and the block layer 25a which have been used in the second embodiment are removed, and a well region (p-well) 22b overlaps with a read-out region 28b. In the plan view in FIG. 11, the outside of an area illustrated by the dashed line is the well region 22b. Since FIG. 11 is the plan view, the illustration of the gate insulation film is omitted. However, the gate insulation film and the extraction-gate electrode 31 on the gate insulation film implement the potential gradient changing means, which controls the potential of the channel formed in the upper portion of the semiconductor region 21 between a buried region 23b and the extraction region 27, and changes the potential profile (potential gradient) and then controls the extraction/non-extraction of charges from the buried region 23b to the extraction region 27 and the transferring/non-transferring of the signal charges from the buried region 23b to the read-out region 28b.

As illustrated in FIG. 11, when charges are extracted from the buried region 23b, the edge of the extraction region 27 serving as the main surface of the charge-entrance surface confronts in parallel to the edge of the buried region 23b, on the planar pattern, just under the extraction-gate electrode 31. Then, on only one side of the buried region 23b, because the extraction-gate electrode 31 is arranged so as to overlap with and lie adjacent to a part of the buried region 23b, when the potential gradient changing means is used to change the potential profile (potential gradient), the electric field toward the extraction region 27 can be generated in the semiconductor region 21 just under the extraction-gate electrode 31, in the entire portion opposite to the extraction region 27 in the buried region 23b. Hence, in the semiconductor element pertaining to the third embodiment, it is possible to improve the extraction efficiency to the extraction region 27 of charges, and it is possible to achieve the high-speed transfer of the signal charges to the read-out region 28b from the buried region 23b, and it is possible to simplify the structure of the pixel. In particular, in the pixel (semiconductor element) in the solid-state imaging device pertaining to the third embodiment, the accumulation region 24a is not used, which results in the potential profile in which the second potential valley PW2 illustrated in FIG. 9 does not exist. Consequently, along the potential gradient to the potential well created by the read-out region 28b from the potential valley created by the buried region 23b, charges are directly transferred to the read-out region 28b at a high efficiency, and the effectiveness substantially similar to the second embodiment is achieved.

In the layout of the pixel in the solid-state imaging device pertaining to the third embodiment illustrated in FIG. 11, since a planar pattern of the well region 22b partially overlaps with a planar pattern of the read-out region 28b, because the well region 22b can be made to have a function equivalent to the block layer 25a, it is possible to remove the leakage of the light to the read-out region 28b from the semiconductor region 21. However, as illustrated in FIG. 11, because a part of the read-out region 28b protrudes from the well region 22b, and the planar pattern of the well region 22b overlaps with the planar pattern of the read-out region 28b, there is a possibility that a potential barrier might be created on the route to the potential well of the read-out region 28b from the potential valley of the buried region 23b by the presence of the well region 22b. Therefore, in the pixel in the solid-state imaging device pertaining to the third embodiment, in order to avoid the creation of the potential barrier, the relation of the impurity concentration between the well region 22b and the read-out region 28b and the relative positional relation are required to be accurately determined. A thick solid line 30b that surrounds a pinning layer 26b located outer than the dashed line indicating the well region 22b indicates the boundary of the element isolation region. That is, the outside of the thick solid line 30b illustrated in FIG. 11 is the region of the element isolation insulation film formed by using the LOCOS method or the STI method or the like.

In this way, according to the solid-state imaging device pertaining to the third embodiment, because the extraction-gate electrode 31 is allocated on only one side of the buried region 23b, and because the transferring/non-transferring of the signal charges to the read-out region 28b can be controlled only by controlling the potential of the extraction-gate electrode 31, differently from the case of the structure disclosed in PTL 3, there is no trouble that the potential gradient becomes zero at the vicinity of the center on the transferring-path of charges. Also, since the potential gradient can be generated in the overall width of the charge-transferring route, the structure of the pixel is simplified, and the transfer efficiency of charges is made high, and therefore a high resolution and a high-speed operation can be achieved.

The Other Embodiments

As mentioned above, the present invention has been described by using the first to third embodiments. However, the discussions and drawings that implement a part of this disclosure should not be understood to limit the present invention. From this disclosure, various modifications, implementations and operational techniques would be evident for one skilled in the art.

Figure 10:
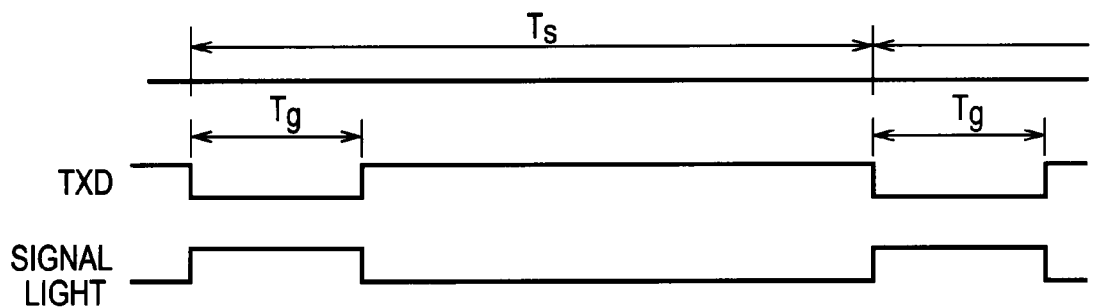
FIG. 10 is a timing diagram when an LED illumination as a light source is relatively increased for background light.

For example, by using the structure described in one of the first to third embodiment of the present invention, a LED illumination, serving as the light source used in the range measurement and the like, can relatively increases the light intensity against the background light. In this case, as illustrated in FIG. 10, in the timing when the LED emits the light, the low voltage as the control signal TXD is applied to the extraction-gate electrode 31, and charges generated by the LED are designed to be transferred to the accumulation region 24, and electrons, generated in a period other than the timing for transferring to the accumulation region 24, are designed to be extracted to the extraction region 27. In this case, by reducing a duty ratio of the light emission when the light is repeatedly emitted from the LED, because it is possible to increase the maximum allowable drive current, as compared with the case of the direct current light emission, it is possible to decrease the number of the LEDs required for the same light emission intensity.

Although the solid-state imaging device pertaining to the third embodiment of the present invention has employed the layout in which, as illustrated in FIG. 11, the areas of the accumulation region 24a and the block layer 25a that are used in the second embodiment are removed and the well region (p-well) 22b overlaps with the read-out region 28b, it is allowable to employ a layout in which the planar pattern of the accumulation region 24a remains and the planar pattern of the well region 22a overlaps with a part of the planar pattern of the read-out region. That is, in the solid-state imaging device pertaining to the second embodiment of the present invention, although the pattern of the block layer 25a illustrated in FIG. 9 is removed, by using the pattern of the accumulation region 24a, the planar pattern of the well region 22a overlaps with a part of the planar pattern of the read-out region. In this case, since the accumulation region 24a remains, similarly to the structure illustrated in FIG. 9, because the second potential valley PW2 remains, and charges are transferred in turn from the first potential valley PW1 created by the buried region 23b through the second potential valley PW2 to the potential well created by the read-out region, the effectiveness substantially similar to the second embodiment is achieved. However, in the case of the layout in which the pattern of the accumulation region 24a remains, because a p-layer of a relatively high concentration does not exist under the region of the accumulation region 24a, the leakage characteristics of electrons to the read-out region from the semiconductor region 21 becomes disadvantageous. However, the employment of the layout in which the block layer 25a is removed can facilitate a merit that the manufacturing step of the solid-state imaging device becomes simple.

Moreover, in the description of the first to third embodiments as mentioned above, they are described under the assumption that the first conductivity type is p-type and the second conductivity type is n-type. However, even under an assumption that the first conductivity type is n-type and the second conductivity type is p-type, the situation that the similar effectiveness can be achieved when the electrical polarities are made opposite may be easily understood.

Also, in the description of the first to third embodiments, although the two-dimensional solid-state imaging device (area sensor) has been exemplified, the semiconductor element of the present invention should not be limitedly construed to be used only in the pixel in the two-dimensional solid-state imaging device. For example, a configuration in which in the two-dimensional matrix illustrated in FIG. 1, as the pixel of the one-dimensional solid-state imaging device (line sensor) of j=m=1, a plurality of semiconductor elements may be one-dimensionally arrayed should be easily understood from the content of the above disclosure.

In this way, the present invention naturally includes various embodiments that are not described herein. Thus, the technical scope of the present invention should be determined only by the subject-matter-to-define-the-invention according to the disclosure of claims, which are reasonable from the above descriptions.

REFERENCE SIGNS LIST $X_{11}$ to $X_{1m}$; $X_{21}$ to $X_{2m}$; ... ; $X_{n1}$ to $X_{nm}$ Pixel
1 Pixel array
2 Horizontal Scanning Circuit
3 Vertical Scanning Circuit
4 Timing Generator
5 Signal Processor
21 Semiconductor Region
22, 22a, 22b Well Region (Outside of Dashed Line is Well Region)
23, 23a, 23b Buried Region
24, 24a Accumulation region
25, 25a Block Region
26, 26a Pinning Layer
27 Extraction region
28, 28a, 28b Charge-Read-Out Region
30 Line indicating Boundary of Element isolation region (Outside of Thick Solid Line is Element isolation Insulation Region)

31 Extraction-Gate Electrode
32 Read-Out Gate Electrode
33 Gate Insulation Film
41 Light Shielding Film
42 Opening

The invention claimed is:

1. A semiconductor element comprising:
a semiconductor region of a first conductivity type;
a buried region of a second conductivity type, being buried in a part of an upper portion of the semiconductor region, configured to be irradiated with optical signal so as to serve as a photodiode together with the semiconductor region;
an extraction region of the second conductivity type, being separated from the buried region and allocated in a part of the semiconductor region, configured to extract charges generated by the photodiode from the buried region at a particular timing as charges not to contribute signal charges, having higher impurity concentration than the buried region;
a read-out region of the second conductivity type, being provided in a part of the semiconductor region, configured to accumulate the charges transferred from the buried region as the signal charges when the charges are not extracted, until the charges are read out, having higher impurity concentration than the buried region; and
an extraction gate electrode formed on a gate insulating film formed on the semiconductor region between the buried region and the extraction region, and arranged only on one side of the buried region, wherein
a route from the buried region to the read-out region is optically shielded from the optical signal, and
a potential gradient changing means, implemented by the gate insulating film and the extraction gate electrode, is configured to
control a potential of a channel formed in the upper portion of the semiconductor region between the buried region and the extraction region at the particular timing, so as to promote the extraction of the charges to the extraction region, while blocking off the transferring of the charges to the read-out region, and
after the particular timing has finished, control the potential of the channel so that the potential gradient can promote the transferring of the signal charges to the read-out region from the buried region.

2. The semiconductor element of claim 1, wherein
the read-out region is separated from the buried region and allocated in a part of the semiconductor region,
the semiconductor element further comprises an accumulation region of the second conductivity type, being allocated in a part of the buried region side on the route from the buried region to the read-out region, configured to create a potential valley deeper than a potential of the bottom of a potential valley created by the buried region for majority carriers in the buried region and shallower than a depth of a potential well for the majority carriers created by the read-out region, and
a potential gradient gradually decreasing from the buried region to the accumulation region is created so that the signal charges can be transferred from the buried region to the accumulation region at timing when the signal charges are scheduled to be transferred.

3. The semiconductor element of claim 1, wherein
the read-out region is continuous to the buried region or allocated in the inside of the buried region so that at least a part of the read-out region can overlap with the buried region,
the semiconductor element further comprises an accumulation region of the second conductivity type continuous to the read-out region, surrounding the read-out region, configured to create a potential valley deeper than a potential of the bottom of a potential valley created by the buried region for majority carriers in the buried region and shallower than a depth of a potential well for the majority carriers created by the read-out region, and
a potential gradient gradually decreasing from the buried region to the accumulation region is created so that the signal charges can be transferred from the buried region to the accumulation region at timing when the signal charges are scheduled to be transferred.

4. The semiconductor element of claim 2, wherein the accumulation region has higher impurity concentration than the buried region.

5. The semiconductor element of claim 1, wherein
the read-out region is continuous to the buried region, or allocated in the inside of the buried region so that at least a part of the read-out region overlaps with the buried region, and
the signal charges are directly transferred from the buried region to the read-out region along a potential gradient gradually decreasing from the buried region to the read-out region, at timing when the signal charges are scheduled to be transferred.

6. The semiconductor element of claim 1, wherein an edge of the extraction region serving as a main surface of a charge-entrance surface confronts in parallel an edge of the buried region in a planar pattern, when the charges are extracted from the buried region to the extraction region.

7. The semiconductor element of claim 2, further comprising a block layer of the first conductivity type, having higher impurity concentration than the semiconductor region, below the accumulation region.

8. The semiconductor element of claim 5, further comprising a well region of the first conductivity type, at least surrounding a part of the extraction region and a periphery of the read-out region, wherein
at least a part of the read-out region is included in the inside of the well region, in a planar pattern.

9. A solid-state imaging device comprising:
a plurality of pixels, a first pixel of the plurality of pixels including:
a semiconductor region of a first conductivity type;
a buried region of a second conductivity type, being buried in a part of an upper portion of the semiconductor region, configured to be irradiated with optical signal so as to serve as a photodiode together with the semiconductor region;
an extraction region of the second conductivity type, being separated from the buried region and allocated in a part of the semiconductor region, configured to extract charges generated by the photodiode from the buried region at a particular timing as charges not to contribute signal charges, having higher impurity concentration than the buried region;
a read-out region of the second conductivity type, being provided in a part of the semiconductor region, configured to accumulate the charges transferred from the buried region as the signal charges when the charges are not extracted, until the charges are read out, having higher impurity concentration than the buried region; and an extraction gate electrode formed on a gate insulating film formed on the semiconductor region between the buried region and the extraction region, and arranged only on one side of the buried region, wherein a route from the buried region to the read-out region is optically shielded from the optical signal, and a potential gradient changing means, implemented by the gate insulating film and the extraction gate electrode, is configured to control a potential of a channel formed in the upper portion of the semiconductor region between the buried region and the extraction region at the particular timing, so as to promote the extraction of the charges to the extraction region, while blocking off the transferring of the charges to the read-out region, and after the particular timing has finished, control the potential of the channel so that the potential gradient can promote the transferring of the signal charges to the read-out region from the buried region.

10. The solid-state imaging device of claim 9, wherein the read-out region is separated from the buried region and allocated in a part of the semiconductor region, the first pixel further comprises an accumulation region of the second conductivity type, being allocated in a part of the buried region side on the route from the buried region to the read-out region, configured to create a potential valley deeper than a potential of the bottom of a potential valley created by the buried region for majority carriers in the buried region and shallower than a depth of a potential well for the majority carriers created by the read-out region, and a potential gradient gradually decreasing from the buried region to the accumulation region is created so that the signal charges can be transferred from the buried region to the accumulation region at timing when the signal charges are scheduled to be transferred.

11. The solid-state imaging device of claim 9, wherein the read-out region is continuous to the buried region or allocated in the inside of the buried region so that at least a part of the read-out region can overlap with the buried region, the first pixel further comprises an accumulation region of the second conductivity type continuous to the read-out region, surrounding the read-out region, configured to create a potential valley deeper than a potential of the bottom of a potential valley created by the buried region for majority carriers in the buried region and shallower than a depth of a potential well for the majority carriers created by the read-out region, and a potential gradient gradually decreasing from the buried region to the accumulation region is created so that the signal charges can be transferred from the buried region to the accumulation region at timing when the signal charges are scheduled to be transferred.

12. The solid-state imaging device of claim 10, wherein the accumulation region has higher impurity concentration than the buried region.

13. The solid-state imaging device of claim 9, wherein the read-out region is continuous to the buried region, or allocated in the inside of the buried region so that at least a part of the read-out region overlaps with the buried region, and the signal charges are directly transferred from the buried region to the read-out region along a potential gradient gradually decreasing from the buried region to the read-out region, at timing when the signal charges are scheduled to be transferred.

14. The solid-state imaging device of claim 9, wherein an edge of the extraction region serving as a main surface of a charge-entrance surface confronts in parallel an edge of the buried region in a planar pattern, when the charges are extracted from the buried region to the extraction region.

15. The solid-state imaging device of claim 10, further comprising a block layer of the first conductivity type, having higher impurity concentration than the semiconductor region, below the accumulation region.

16. The solid-state imaging device of claim 13, further comprising a well region of the first conductivity type, which at least surrounding a part of the extraction region and a periphery of the read-out region, wherein at least a part of the read-out region is included in the inside of the well region, in a planar pattern.

17. The solid-state imaging device of claim 10, wherein the read-out region is connected to a gate electrode of a read-out transistor assigned in each of the pixels.

18. The solid-state imaging device of claim 17, wherein the read-out region serves as a source electrode of a reset transistor or is connected to the source electrode of the reset transistor.

* * * * *